(12) United States Patent
Costa et al.

(10) Patent No.: US 11,127,648 B2
(45) Date of Patent: Sep. 21, 2021

(54) THERMALLY ENHANCED SEMICONDUCTOR PACKAGE WITH AT LEAST ONE HEAT EXTRACTOR AND PROCESS FOR MAKING THE SAME

(71) Applicant: Qorvo US, Inc., Greensboro, NC (US)

(72) Inventors: Julio C. Costa, Oak Ridge, NC (US); George Maxim, Saratoga, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/204,214

(22) Filed: Nov. 29, 2018

(65) Prior Publication Data
US 2020/0176347 A1   Jun. 4, 2020

(51) Int. Cl.
| | | |
|---|---|---|
| *H01L 23/28* | (2006.01) | |
| *H01L 23/48* | (2006.01) | |
| *H01L 23/52* | (2006.01) | |
| *H01L 23/36* | (2006.01) | |
| *H01L 23/31* | (2006.01) | |
| *H01L 23/482* | (2006.01) | |
| *H01L 23/495* | (2006.01) | |

(Continued)

(52) U.S. Cl.
CPC .......... *H01L 23/36* (2013.01); *H01L 23/3128* (2013.01); *H01L 23/4828* (2013.01); *H01L 23/498* (2013.01); *H01L 23/49568* (2013.01); *H05K 1/021* (2013.01); *H05K 2201/09118* (2013.01)

(58) Field of Classification Search
CPC ............. H01L 23/3128; H01L 23/4828; H01L 23/49568; H01L 23/498; H01L 23/42; H01L 23/4334; H01L 33/64; H01L 23/488

USPC .......................... 257/796, 786, 778, 782, 783
See application file for complete search history.

(56) References Cited

U.S. PATENT DOCUMENTS

| | | | |
|---|---|---|---|
| 4,093,562 | A | 6/1978 | Kishimoto |
| 4,366,202 | A | 12/1982 | Borovsky |

(Continued)

FOREIGN PATENT DOCUMENTS

| | | |
|---|---|---|
| CN | 1696231 A | 11/2005 |
| CN | 102956468 A | 3/2013 |

(Continued)

OTHER PUBLICATIONS

Non-Final Office Action for U.S. Appl. No. 15/676,693, dated May 3, 2018, 14 pages.

(Continued)

*Primary Examiner* — Kimberly N Rizkallah
*Assistant Examiner* — Dilinh P Nguyen
(74) *Attorney, Agent, or Firm* — Withrow & Terranova, P.L.L.C.

(57) ABSTRACT

The present disclosure relates to a thermally enhanced package, which includes a carrier, a thinned die over the carrier, a mold compound, and a heat extractor. The thinned die includes a device layer over the carrier and a dielectric layer over the device layer. The mold compound resides over the carrier, surrounds the thinned die, and extends beyond a top surface of the thinned die to define an opening within the mold compound and over the thinned die. The top surface of the thinned die is at a bottom of the opening. At least a portion of the heat extractor is inserted into the opening and in thermal contact with the thinned die. Herein the heat extractor is formed of a metal or an alloy.

15 Claims, 13 Drawing Sheets

(51) Int. Cl.
*H01L 23/498* (2006.01)
*H05K 1/02* (2006.01)

(56) References Cited

U.S. PATENT DOCUMENTS

| | | |
|---|---|---|
| 5,013,681 A | 5/1991 | Godbey et al. |
| 5,061,663 A | 10/1991 | Bolt et al. |
| 5,069,626 A | 12/1991 | Patterson et al. |
| 5,362,972 A | 11/1994 | Yazawa et al. |
| 5,391,257 A | 2/1995 | Sullivan et al. |
| 5,459,368 A | 10/1995 | Onishi et al. |
| 5,646,432 A | 7/1997 | Iwaki et al. |
| 5,648,013 A | 7/1997 | Uchida et al. |
| 5,699,027 A | 12/1997 | Tsuji et al. |
| 5,709,960 A | 1/1998 | Mays et al. |
| 5,729,075 A | 3/1998 | Strain |
| 5,831,369 A | 11/1998 | Forbacher et al. |
| 5,920,142 A | 7/1999 | Onishi et al. |
| 6,072,557 A | 6/2000 | Kishimoto |
| 6,084,284 A | 7/2000 | Adamic, Jr. |
| 6,154,366 A | 11/2000 | Ma et al. |
| 6,154,372 A | 11/2000 | Kalivas et al. |
| 6,235,554 B1 | 5/2001 | Akram et al. |
| 6,236,061 B1 | 5/2001 | Walpita |
| 6,268,654 B1 | 7/2001 | Glenn et al. |
| 6,271,469 B1 | 8/2001 | Ma et al. |
| 6,377,112 B1 | 4/2002 | Rozsypal |
| 6,423,570 B1 | 7/2002 | Ma et al. |
| 6,426,559 B1 | 7/2002 | Bryan et al. |
| 6,441,498 B1 * | 8/2002 | Song .............. H01L 23/13 257/778 |
| 6,446,316 B1 | 9/2002 | Fürbacher et al. |
| 6,578,458 B1 | 6/2003 | Akram et al. |
| 6,649,012 B2 | 11/2003 | Masayuki et al. |
| 6,703,688 B1 | 3/2004 | Fitzergald |
| 6,713,859 B1 | 3/2004 | Ma |
| 6,841,413 B2 | 1/2005 | Liu et al. |
| 6,864,156 B1 | 3/2005 | Conn |
| 6,902,950 B2 | 6/2005 | Ma et al. |
| 6,943,429 B1 | 9/2005 | Glenn et al. |
| 6,964,889 B2 | 11/2005 | Ma et al. |
| 6,992,400 B2 | 1/2006 | Tikka et al. |
| 7,042,072 B1 | 5/2006 | Kim et al. |
| 7,049,692 B2 | 5/2006 | Nishimura et al. |
| 7,109,635 B1 | 9/2006 | McClure et al. |
| 7,183,172 B2 | 2/2007 | Lee et al. |
| 7,190,064 B2 | 3/2007 | Wakabayashi et al. |
| 7,238,560 B2 | 7/2007 | Sheppard et al. |
| 7,279,750 B2 | 10/2007 | Jobetto |
| 7,288,435 B2 | 10/2007 | Aigner et al. |
| 7,307,003 B2 | 12/2007 | Reif et al. |
| 7,393,770 B2 | 7/2008 | Wood et al. |
| 7,402,901 B2 | 7/2008 | Hatano et al. |
| 7,427,824 B2 | 9/2008 | Iwamoto et al. |
| 7,489,032 B2 | 2/2009 | Jobetto |
| 7,596,849 B1 | 10/2009 | Carpenter et al. |
| 7,619,347 B1 | 11/2009 | Bhattacharjee |
| 7,635,636 B2 | 12/2009 | McClure et al. |
| 7,714,535 B2 | 5/2010 | Yamazaki et al. |
| 7,749,882 B2 | 7/2010 | Kweon et al. |
| 7,790,543 B2 | 9/2010 | Abadeer et al. |
| 7,843,072 B1 | 11/2010 | Park et al. |
| 7,855,101 B2 | 12/2010 | Furman et al. |
| 7,868,419 B1 | 1/2011 | Kerr et al. |
| 7,910,405 B2 | 3/2011 | Okada et al. |
| 7,960,218 B2 | 6/2011 | Ma et al. |
| 8,004,089 B2 | 8/2011 | Jobetto |
| 8,183,151 B2 | 5/2012 | Lake |
| 8,420,447 B2 | 4/2013 | Tay et al. |
| 8,503,186 B2 | 8/2013 | Lin et al. |
| 8,643,148 B2 | 2/2014 | Lin et al. |
| 8,658,475 B1 | 2/2014 | Kerr |
| 8,664,044 B2 | 3/2014 | Jin et al. |
| 8,772,853 B2 | 7/2014 | Hong et al. |
| 8,791,532 B2 | 7/2014 | Graf et al. |
| 8,802,495 B2 | 8/2014 | Kim et al. |
| 8,803,242 B2 | 8/2014 | Marino et al. |
| 8,816,407 B2 | 8/2014 | Kim et al. |
| 8,835,978 B2 | 9/2014 | Mauder et al. |
| 8,906,755 B1 | 12/2014 | Hekmatshoartabari et al. |
| 8,921,990 B2 | 12/2014 | Park et al. |
| 8,927,968 B2 | 1/2015 | Cohen et al. |
| 8,941,248 B2 | 1/2015 | Lin et al. |
| 8,963,321 B2 | 2/2015 | Lenniger et al. |
| 8,983,399 B2 | 3/2015 | Kawamura et al. |
| 9,064,883 B2 | 6/2015 | Meyer et al. |
| 9,165,793 B1 | 10/2015 | Wang et al. |
| 9,214,337 B2 | 12/2015 | Carroll et al. |
| 9,349,700 B2 | 5/2016 | Hsieh et al. |
| 9,368,429 B2 | 6/2016 | Ma et al. |
| 9,406,637 B2 | 8/2016 | Wakisaka et al. |
| 9,461,001 B1 | 10/2016 | Tsai et al. |
| 9,520,428 B2 | 12/2016 | Fujimori |
| 9,530,709 B2 | 12/2016 | Leipold et al. |
| 9,613,831 B2 | 4/2017 | Morris et al. |
| 9,646,856 B2 | 5/2017 | Meyer et al. |
| 9,653,428 B1 | 5/2017 | Hiner et al. |
| 9,786,586 B1 | 10/2017 | Shih |
| 9,812,350 B2 | 11/2017 | Costa |
| 9,824,951 B2 | 11/2017 | Leipold et al. |
| 9,824,974 B2 | 11/2017 | Gao et al. |
| 9,859,254 B1 | 1/2018 | Yu et al. |
| 9,875,971 B2 | 1/2018 | Bhushan et al. |
| 9,941,245 B2 | 4/2018 | Skeete et al. |
| 10,134,837 B1 | 11/2018 | Fanelli et al. |
| 10,727,212 B2 | 7/2020 | Moon et al. |
| 10,784,348 B2 | 9/2020 | Fanelli et al. |
| 2001/0004131 A1 | 6/2001 | Masayuki et al. |
| 2002/0070443 A1 | 6/2002 | Mu et al. |
| 2002/0074641 A1 | 6/2002 | Towle et al. |
| 2002/0127769 A1 | 9/2002 | Ma et al. |
| 2002/0127780 A1 | 9/2002 | Ma et al. |
| 2002/0137263 A1 | 9/2002 | Towle et al. |
| 2002/0185675 A1 | 12/2002 | Furukawa |
| 2003/0207515 A1 | 11/2003 | Tan et al. |
| 2004/0021152 A1 | 2/2004 | Nguyen et al. |
| 2004/0164367 A1 | 8/2004 | Park |
| 2004/0166642 A1 | 8/2004 | Chen et al. |
| 2004/0219765 A1 | 11/2004 | Reif et al. |
| 2005/0037595 A1 | 2/2005 | Nakahata |
| 2005/0077511 A1 | 4/2005 | Fitzergald |
| 2005/0079686 A1 | 4/2005 | Aigner et al. |
| 2005/0212419 A1 | 9/2005 | Vazan et al. |
| 2006/0057782 A1 | 3/2006 | Gardes et al. |
| 2006/0099781 A1 | 5/2006 | Beaumont et al. |
| 2006/0105496 A1 | 5/2006 | Chen et al. |
| 2006/0108585 A1 | 5/2006 | Gan et al. |
| 2006/0228074 A1 | 10/2006 | Lipson et al. |
| 2006/0261446 A1 | 11/2006 | Wood et al. |
| 2007/0020807 A1 | 1/2007 | Geefay et al. |
| 2007/0045738 A1 | 3/2007 | Jones et al. |
| 2007/0069393 A1 | 3/2007 | Asahi et al. |
| 2007/0075317 A1 | 4/2007 | Kato et al. |
| 2007/0121326 A1 | 5/2007 | Nall et al. |
| 2007/0158746 A1 | 7/2007 | Ohguro |
| 2007/0181992 A1 | 8/2007 | Lake |
| 2007/0190747 A1 | 8/2007 | Humpston et al. |
| 2007/0194342 A1 | 8/2007 | Kinzer |
| 2007/0252481 A1 | 11/2007 | Iwamoto et al. |
| 2007/0276092 A1 | 11/2007 | Kanae et al. |
| 2008/0050852 A1 | 2/2008 | Hwang et al. |
| 2008/0050901 A1 | 2/2008 | Kweon et al. |
| 2008/0164528 A1 | 7/2008 | Cohen et al. |
| 2008/0265978 A1 | 10/2008 | Englekirk |
| 2008/0272497 A1 | 11/2008 | Lake |
| 2008/0277800 A1 | 11/2008 | Hwang et al. |
| 2008/0315372 A1 | 12/2008 | Kuan et al. |
| 2009/0008714 A1 | 1/2009 | Chae |
| 2009/0010056 A1 | 1/2009 | Kuo et al. |
| 2009/0014856 A1 | 1/2009 | Knickerbocker |
| 2009/0090979 A1 | 4/2009 | Zhu et al. |
| 2009/0179266 A1 | 7/2009 | Abadeer et al. |
| 2009/0243097 A1 | 10/2009 | Koroku et al. |
| 2009/0261460 A1 | 10/2009 | Kuan et al. |

(56) References Cited

U.S. PATENT DOCUMENTS

| | | | |
|---|---|---|---|
| 2009/0302484 A1* | 12/2009 | Lee | H01L 25/50 257/777 |
| 2010/0003803 A1 | 1/2010 | Oka et al. | |
| 2010/0012354 A1 | 1/2010 | Hedin et al. | |
| 2010/0029045 A1 | 2/2010 | Ramanathan et al. | |
| 2010/0045145 A1 | 2/2010 | Tsuda | |
| 2010/0081232 A1 | 4/2010 | Furman et al. | |
| 2010/0081237 A1 | 4/2010 | Wong et al. | |
| 2010/0109122 A1 | 5/2010 | Ding et al. | |
| 2010/0120204 A1 | 5/2010 | Kunimoto | |
| 2010/0127340 A1 | 5/2010 | Sugizaki | |
| 2010/0173436 A1 | 7/2010 | Ouellet et al. | |
| 2010/0200919 A1 | 8/2010 | Kikuchi | |
| 2010/0314637 A1 | 12/2010 | Kim et al. | |
| 2011/0003433 A1 | 1/2011 | Harayama et al. | |
| 2011/0026232 A1 | 2/2011 | Lin et al. | |
| 2011/0036400 A1 | 2/2011 | Murphy et al. | |
| 2011/0062549 A1 | 3/2011 | Lin | |
| 2011/0068433 A1 | 3/2011 | Kim et al. | |
| 2011/0102002 A1 | 5/2011 | Riehl et al. | |
| 2011/0171792 A1 | 7/2011 | Chang et al. | |
| 2011/0272800 A1 | 11/2011 | Chino | |
| 2011/0272824 A1 | 11/2011 | Pagaila | |
| 2011/0294244 A1 | 12/2011 | Hattori et al. | |
| 2012/0003813 A1 | 1/2012 | Chuang et al. | |
| 2012/0045871 A1 | 2/2012 | Lee et al. | |
| 2012/0068276 A1 | 3/2012 | Lin et al. | |
| 2012/0094418 A1 | 4/2012 | Grama et al. | |
| 2012/0098074 A1 | 4/2012 | Lin et al. | |
| 2012/0104495 A1 | 5/2012 | Zhu et al. | |
| 2012/0119346 A1 | 5/2012 | Im et al. | |
| 2012/0153393 A1 | 6/2012 | Liang et al. | |
| 2012/0168863 A1 | 7/2012 | Zhu et al. | |
| 2012/0256260 A1 | 10/2012 | Cheng et al. | |
| 2012/0292700 A1 | 11/2012 | Khakifirooz et al. | |
| 2012/0299105 A1 | 11/2012 | Cai et al. | |
| 2013/0001665 A1 | 1/2013 | Zhu et al. | |
| 2013/0015429 A1 | 1/2013 | Hong et al. | |
| 2013/0049205 A1 | 2/2013 | Meyer et al. | |
| 2013/0099315 A1 | 4/2013 | Zhu et al. | |
| 2013/0105966 A1 | 5/2013 | Kelkar et al. | |
| 2013/0147009 A1 | 6/2013 | Kim | |
| 2013/0155681 A1 | 6/2013 | Nall et al. | |
| 2013/0196483 A1 | 8/2013 | Dennard et al. | |
| 2013/0200456 A1 | 8/2013 | Zhu et al. | |
| 2013/0221493 A1 | 8/2013 | Kim et al. | |
| 2013/0241040 A1 | 9/2013 | Tojo et al. | |
| 2013/0280826 A1 | 10/2013 | Scanlan et al. | |
| 2013/0299871 A1 | 11/2013 | Mauder et al. | |
| 2014/0015131 A1 | 1/2014 | Meyer et al. | |
| 2014/0035129 A1 | 2/2014 | Stuber et al. | |
| 2014/0134803 A1 | 5/2014 | Kelly et al. | |
| 2014/0168014 A1 | 6/2014 | Chih et al. | |
| 2014/0197530 A1 | 7/2014 | Meyer et al. | |
| 2014/0210314 A1 | 7/2014 | Bhattacharjee et al. | |
| 2014/0219604 A1 | 8/2014 | Hackler, Sr. et al. | |
| 2014/0252566 A1 | 9/2014 | Kerr et al. | |
| 2014/0252567 A1 | 9/2014 | Carroll et al. | |
| 2014/0264813 A1 | 9/2014 | Lin et al. | |
| 2014/0264818 A1 | 9/2014 | Lowe, Jr. et al. | |
| 2014/0306324 A1 | 10/2014 | Costa et al. | |
| 2014/0327003 A1 | 11/2014 | Fuergut et al. | |
| 2014/0327150 A1 | 11/2014 | Jung et al. | |
| 2014/0346573 A1 | 11/2014 | Adam et al. | |
| 2014/0356602 A1 | 12/2014 | Oh et al. | |
| 2015/0015321 A1 | 1/2015 | Dribinsky et al. | |
| 2015/0108666 A1 | 4/2015 | Engelhardt et al. | |
| 2015/0115416 A1 | 4/2015 | Costa et al. | |
| 2015/0130045 A1* | 5/2015 | Tseng | H01L 23/36 257/712 |
| 2015/0136858 A1* | 5/2015 | Finn | G06K 19/07754 235/492 |
| 2015/0197419 A1 | 7/2015 | Cheng et al. | |
| 2015/0235990 A1 | 8/2015 | Cheng et al. | |
| 2015/0235993 A1 | 8/2015 | Cheng et al. | |
| 2015/0243881 A1 | 8/2015 | Sankman et al. | |
| 2015/0255368 A1 | 9/2015 | Costa | |
| 2015/0262844 A1 | 9/2015 | Meyer et al. | |
| 2015/0279789 A1 | 10/2015 | Mahajan et al. | |
| 2015/0311132 A1 | 10/2015 | Kuo et al. | |
| 2015/0364344 A1 | 12/2015 | Yu et al. | |
| 2015/0380394 A1 | 12/2015 | Jang et al. | |
| 2015/0380523 A1 | 12/2015 | Hekmatshoartabari et al. | |
| 2016/0002510 A1 | 1/2016 | Champagne et al. | |
| 2016/0056544 A1* | 2/2016 | Garcia | H01Q 1/38 343/725 |
| 2016/0079137 A1 | 3/2016 | Leipold et al. | |
| 2016/0093580 A1 | 3/2016 | Scanlan et al. | |
| 2016/0100489 A1 | 4/2016 | Costa et al. | |
| 2016/0126111 A1 | 5/2016 | Leipold et al. | |
| 2016/0126196 A1 | 5/2016 | Leipold et al. | |
| 2016/0133591 A1 | 5/2016 | Hong et al. | |
| 2016/0155706 A1 | 6/2016 | Yoneyama et al. | |
| 2016/0284568 A1* | 9/2016 | Morris | H01L 21/568 |
| 2016/0284570 A1 | 9/2016 | Morris et al. | |
| 2016/0343592 A1 | 11/2016 | Costa et al. | |
| 2016/0343604 A1 | 11/2016 | Costa et al. | |
| 2016/0347609 A1 | 12/2016 | Yu et al. | |
| 2016/0362292 A1 | 12/2016 | Chang et al. | |
| 2017/0024503 A1 | 1/2017 | Connelly | |
| 2017/0032957 A1 | 2/2017 | Costa et al. | |
| 2017/0033026 A1 | 2/2017 | Ho et al. | |
| 2017/0053938 A1 | 2/2017 | Whitefield | |
| 2017/0077028 A1 | 3/2017 | Maxim et al. | |
| 2017/0098587 A1 | 4/2017 | Leipold et al. | |
| 2017/0190572 A1 | 7/2017 | Pan et al. | |
| 2017/0200648 A1 | 7/2017 | Lee et al. | |
| 2017/0207350 A1 | 7/2017 | Leipold et al. | |
| 2017/0263539 A1 | 9/2017 | Gowda et al. | |
| 2017/0271200 A1 | 9/2017 | Costa | |
| 2017/0323804 A1 | 11/2017 | Costa et al. | |
| 2017/0323860 A1 | 11/2017 | Costa et al. | |
| 2017/0334710 A1 | 11/2017 | Costa et al. | |
| 2017/0358511 A1 | 12/2017 | Costa et al. | |
| 2018/0019184 A1 | 1/2018 | Costa et al. | |
| 2018/0019185 A1 | 1/2018 | Costa et al. | |
| 2018/0044169 A1 | 2/2018 | Hatcher, Jr. et al. | |
| 2018/0044177 A1 | 2/2018 | Vandemeer et al. | |
| 2018/0047653 A1 | 2/2018 | Costa et al. | |
| 2018/0076174 A1 | 3/2018 | Costa et al. | |
| 2018/0138082 A1 | 5/2018 | Costa et al. | |
| 2018/0145678 A1 | 5/2018 | Maxim et al. | |
| 2018/0166358 A1 | 6/2018 | Costa et al. | |
| 2018/0269188 A1 | 9/2018 | Yu et al. | |
| 2019/0013254 A1 | 1/2019 | Costa et al. | |
| 2019/0013255 A1 | 1/2019 | Costa et al. | |
| 2019/0043812 A1 | 2/2019 | Leobandung | |
| 2019/0074263 A1 | 3/2019 | Costa et al. | |
| 2019/0074271 A1 | 3/2019 | Costa et al. | |
| 2019/0172842 A1 | 6/2019 | Whitefield | |
| 2019/0189599 A1* | 6/2019 | Baloglu | H01L 25/105 |
| 2019/0287953 A1 | 9/2019 | Moon et al. | |
| 2019/0304910 A1 | 10/2019 | Fillion | |
| 2019/0312110 A1 | 10/2019 | Costa et al. | |
| 2019/0326159 A1 | 10/2019 | Costa et al. | |
| 2019/0378819 A1 | 12/2019 | Costa et al. | |
| 2020/0006193 A1 | 1/2020 | Costa et al. | |
| 2020/0058541 A1 | 2/2020 | Konishi et al. | |

FOREIGN PATENT DOCUMENTS

| | | |
|---|---|---|
| CN | 103811474 A | 5/2014 |
| CN | 103872012 A | 6/2014 |
| EP | 2996143 A1 | 3/2016 |
| JP | S505733 Y1 | 2/1975 |
| JP | H11-220077 * | 8/1999 |
| JP | H11-220077 A | 8/1999 |
| JP | 200293957 A | 3/2002 |
| JP | 2002252376 A | 9/2002 |
| JP | 2004273604 A | 9/2004 |
| JP | 2004327557 A | 11/2004 |
| JP | 2006005025 A | 1/2006 |
| JP | 2007227439 A | 9/2007 |
| JP | 2008235490 A | 10/2008 |

(56) References Cited

FOREIGN PATENT DOCUMENTS

| | | | |
|---|---|---|---|
| JP | 2008279567 A | 11/2008 | |
| JP | 2009026880 A | 2/2009 | |
| JP | 2009530823 A | 8/2009 | |
| JP | 2009200274 A | 9/2009 | |
| JP | 2009302526 A | 12/2009 | |
| JP | 2011216780 A | 10/2011 | |
| JP | 2011243596 A | 12/2011 | |
| JP | 2012129419 A | 7/2012 | |
| JP | 2012156251 A | 8/2012 | |
| JP | 2013162096 A | 8/2013 | |
| JP | 2013222745 A | 10/2013 | |
| JP | 2013254918 A | 12/2013 | |
| JP | 2014509448 A | 4/2014 | |
| TW | 201733056 A | 9/2017 | |
| WO | 2007074651 A1 | 7/2007 | |
| WO | 2018083961 A1 | 5/2018 | |
| WO | 2018125242 A1 | 7/2018 | |

OTHER PUBLICATIONS

Notice of Allowance for U.S. Appl. No. 15/789,107, dated May 18, 2018, 8 pages.
Final Office Action for U.S. Appl. No. 15/616,109, dated Apr. 19, 2018, 18 pages.
Notice of Allowance for U.S. Appl. No. 15/676,693, dated Jul. 20, 2018, 8 pages.
Notice of Allowance for U.S. Appl. No. 15/695,629, dated Jul. 11, 2018, 12 pages.
Notice of Allowance for U.S. Appl. No. 15/387,855, dated Aug. 10, 2018, 7 pages.
Notice of Allowance for U.S. Appl. No. 15/914,538, dated Aug. 1, 2018, 9 pages.
Notice of Allowance and Applicant-Initiated Interview Summary for U.S. Appl. No. 15/262,457, dated Sep. 28, 2018, 16 pages.
Corrected Notice of Allowance for U.S. Appl. No. 15/676,693, dated Aug. 29, 2018, 5 pages.
Final Office Action for U.S. Appl. No. 15/601,858, dated Nov. 26, 2018, 16 pages.
Non-Final Office Action for U.S. Appl. No. 15/945,418, dated Nov. 1, 2018, 13 pages.
First Office Action for Chinese Patent Application No. 201510746323.X, dated Nov. 2, 2018, 12 pages.
Advisory Action for U.S. Appl. No. 15/601,858, dated Jan. 22, 2019, 3 pages.
Notice of Allowance for U.S. Appl. No. 16/038,879, dated Jan. 9, 2019, 8 pages.
Notice of Allowance for U.S. Appl. No. 16/004,961, dated Jan. 11, 2019, 8 pages.
International Preliminary Report on Patentability for PCT/US2017/046744, dated Feb. 21, 2019, 11 pages.
International Preliminary Report on Patentability for PCT/US2017/046758, dated Feb. 21, 2019, 11 pages.
International Preliminary Report on Patentability for PCT/US2017/046779, dated Feb. 21, 2019, 11 pages.
Non-Final Office Action for U.S. Appl. No. 15/992,613, dated Feb. 27, 2019, 15 pages.
Non-Final Office Action for U.S. Appl. No. 15/695,579, dated Jan. 28, 2019, 8 pages.
Notice of Allowance for U.S. Appl. No. 15/992,639, dated May 9, 2019, 7 pages.
Notice of Allowance for U.S. Appl. No. 15/695,579, dated Mar. 20, 2019, 8 pages.
Notice of Allowance for U.S. Appl. No. 16/004,961, dated May 13, 2019, 8 pages.
Non-Final Office Action for U.S. Appl. No. 15/601,858, dated Apr. 17, 2019, 9 pages.
Tsai, Chun-Lin, et al., "Smart GaN platform; Performance & Challenges," IEEE International Electron Devices Meeting, 2017, 4 pages.
Tsai, Szu-Ping., et al., "Performance Enhancement of Flip-Chip Packaged AlGAaN/GaN HEMTs by Strain Engineering Design," IEEE Transcations on Electron Devices, vol. 63, Issue 10, Oct. 2016, pp. 3876-3881.
Final Office Action for U.S. Appl. No. 15/992,613, dated May 24, 2019, 11 pages.
Non-Final Office Action for U.S. Appl. No. 15/873,152, dated May 24, 2019, 11 pages.
Notice of Allowance for U.S. Appl. No. 16/168,327, dated Jun. 28, 2019, 7 pages.
Lin, Yueh, Chin, et al., "Enhancement-Mode GaN MIS-HEMTs With LaHfOx Gate Insulator for Power Application," IEEE Electronic Device Letters, vol. 38, Issue 8, 2017, 4 pages.
Shukla, Shishir, et al., "GaN-on-Si Switched Mode RF Power Amplifiers for Non-Constant Envelope Signals," IEEE Topical Conference on RF/Microwave Power Amplifiers for Radio and Wireless Applications, 2017, pp. 88-91.
International Search Report and Written Opinion for International Patent Application No. PCT/US19/25591, dated Jun. 21, 2019, 7 pages.
Notice of Reasons for Refusal for Japanese Patent Application No. 2015-180657, dated Jul. 9, 2019, 4 pages.
Notice of Allowance for U.S. Appl. No. 15/601,858, dated Aug. 16, 2019, 8 pages.
Advisory Action for U.S. Appl. No. 15/992,613, dated Jul. 29, 2019, 3 pages.
Final Office Action for U.S. Appl. No. 15/873,152, dated Aug. 8, 2019, 13 pages.
Notice of Allowance for U.S. Appl. No. 15/975,230, dated Jul. 22, 2019, 7 pages.
Notice of Allowance for U.S. Appl. No. 16/004,961, dated Aug. 28, 2019, 8 pages.
Notice of Allowance for U.S. Appl. No. 15/992,613, dated Sep. 23, 2019, 7 pages.
Non-Final Office Action for U.S. Appl. No. 15/816,637, dated Oct. 31, 2019, 10 pages.
Advisory Action for U.S. Appl. No. 15/873,152, dated Oct. 11, 2019, 3 pages.
Ali, K. Ben et al., "RF SOI CMOS Technology on Commercial Trap-Rich High Resistivity SOI Wafer," 2012 IEEE International SOI Conference (SOI), Oct. 1-4, 2012, Napa, California, IEEE, 2 pages.
Anderson, D.R., "Thermal Conductivity of Polymers," Sandia Corporation, Mar. 8, 1966, pp. 677-690.
Author Unknown, "96% Alumina, thick-film, as fired," MatWeb, Date Unknown, date accessed Apr. 6, 2016, 2 pages, http://www.matweb.com/search/DataSheet.aspx?MatGUID=3996a734395a4870a9739076918c4297&ckck=1.
Author Unknown, "CoolPoly D5108 Thermally Conductive Polyphenylene Sulfide (PPS)," Cool Polymers, Inc., Aug. 8, 2007, 2 pages.
Author Unknown, "CoolPoly D5506 Thermally Conductive Liquid Crystalline Polymer (LCP)," Cool Polymers, Inc., Dec. 12, 2013, 2 pages.
Author Unknown, "CoolPoly D-Series—Thermally Conductive Dielectric Plastics," Cool Polymers, Retrieved Jun. 24, 2013, http://coolpolymers.com/dseries.asp, 1 page.
Author Unknown, "CoolPoly E2 Thermally Conductive Liquid Crystalline Polymer (LCP)," Cool Polymers, Inc., Aug. 8, 2007, http://www.coolpolymers.com/Files/DS/Datasheet_e2.pdf, 1 page.
Author Unknown, "CoolPoly E3605 Thermally Conductive Polyamide 4,6 (PA 4,6)," Cool Polymers, Inc., Aug. 4, 2007, 1 page, http://www.coolpolymers.com/Files/DS/Datasheet_e3605.pdf.
Author Unknown, "CoolPoly E5101 Thermally Conductive Polyphenylene Sulfide (PPS)," Cool Polymers, Inc., Aug. 27, 2007, 1 page, http://www.coolpolymers.com/Files/DS/Datasheet_e5101.pdf.
Author Unknown, "CoolPoly E5107 Thermally Conductive Polyphenylene Sulfide (PPS)," Cool Polymers, Inc., Aug. 8, 2007, 1 page, http://coolpolymers.com/Files/DS/Datasheet_e5107.pdf.
Author Unknown, "CoolPoly Selection Tool," Cool Polymers, Inc., 2006, 1 page, http://www.coolpolymers.com/select.asp?Application=Substrates+%26+Electcronic_Packaging.

(56) References Cited

OTHER PUBLICATIONS

Author Unknown, "CoolPoly Thermally Conductive Plastics for Dielectric Heat Plates," Cool Polymers, Inc., 2006, 2 pages, http://www.coolpolymers.com/heatplate.asp.
Author Unknown, "CoolPoly Thermally Conductive Plastics for Substrates and Electronic Packaging," Cool Polymers, Inc., 2005, 1 page.
Author Unknown, "Electrical Properties of Plastic Materials," Professional Plastics, Oct. 28, 2011, http://www.professionalplastics.com/professionalplastics/ElectricalPropertiesofPlastics.pdf, accessed Dec. 18, 2014, 4 pages.
Author Unknown, "Fully Sintered Ferrite Powders," Powder Processing and Technology, LLC, Date Unknown, 1 page.
Author Unknown, "Heat Transfer," Cool Polymers, Inc., 2006, http://www.coolpolymers.com/heattrans.html, 2 pages.
Author Unknown, "Hysol UF3808," Henkel Corporation, Technical Data Sheet, May 2013, 2 pages.
Author Unknown, "PolyOne Therma-Tech™ LC-5000C TC LCP," MatWeb, Date Unknown, date accessed Apr. 6, 2016, 2 pages, http://www.matweb.com/search/datasheettext.aspx?matguid=89754e8bb26148d083c5ebb05a0cbff1.
Author Unknown, "Sapphire Substrate," from CRC Handbook of Chemistry and Physics, Date Unknown, 1 page.
Author Unknown, "Thermal Properties of Plastic Materials," Professional Plastics, Aug. 21, 2010, http://www.professionalplastics.com/professionalplastics/ThermalPropertiesofPlasticMaterials.pdf, accessed Dec. 18, 2014, 4 pages.
Author Unknown, "Thermal Properties of Solids," PowerPoint Presentation, No Date, 28 slides, http://www.phys.huji.ac.il/Phys_Hug/Lectures/77602/PHONONS_2_thermal.pdf.
Author Unknown, "Thermal Resistance & Thermal Conductance," C-Therm Technologies Ltd., accessed Sep. 19, 2013, 4 pages, http://www.ctherm.com/products/tci_thermal_conductivity/helpful_links_tools/thermal_resistance_thermal_conductance/.
Author Unknown, "The Technology: AKHAN's Approach and Solution: The Miraj Diamond™ Platform," 2015, accessed Oct. 9, 2016, http://www.akhansemi.com/technologyhtml#the-miraj-diamond-plafform, 5 pages.
Beck, D., et al., "CMOS on FZ-High Resistivity Substrate for Monolithic Integration of SiGe-RF-Circuitry and Readout Electronics," IEEE Transactions on Electron Devices, vol. 44, No. 7, Jul. 1997, pp. 1091-1101.
Botula, A., et al., "A Thin-Film SOI 180nm CMOS RF Switch Technology," IEEE Topical Meeting on Silicon Monolithic Integrated Circuits in RF Systems, (SiRF '09), Jan. 2009, pp. 1-4.
Carroll, M., et al., "High-Resistivity SOI CMOS Cellular Antenna Switches," Annual IEEE Compound Semiconductor Integrated Circuit Symposium, (CISC 2009), Oct. 2009, pp. 1-4.
Colinge, J.P., et al., "A Low-Voltage, Low-Power Microwave SOI MOSFET," Proceedings of 1996 IEEE International SOI Conference, Oct. 1996, pp. 128-129.
Costa, J. et al., "Integrated MEMS Switch Technology on SOI-CMOS," Proceedings of Hilton Head Workshop: A Solid-State Sensors, Actuators and Microsystems Workshop, Jun. 1-5, 2008, Hilton Head Island, SC, IEEE, pp. 900-903.
Costa, J. et al., "Silicon RFCMOS SOI Technology with Above-IC MEMS Integration for Front End Wireless Applications," Bipolar/BiCMOS Circuits and Technology Meeting, 2008, BCTM 2008, IEEE, pp. 204-207.
Costa, J., "RFCMOS SOI Technology for 4G Reconfigurable RF Solutions," Session WEC1-2, Proceedings of the 2013 IEEE International Microwave Symposium, 4 pages.
Esfeh, Babak Kazemi et al., "RF Non-Linearities from Si-Based Substrates," 2014 International Workshop on Integrated Nonlinear Microwave and Millimetre-wave Circuits (INMMiC), Apr. 2-4, 2014, IEEE, 3 pages.
Finne, R. M. et al., "A Water-Amine-Complexing Agent System for Etching Silicon," Journal of the Electrochemical Society, vol. 114, No. 9, Sep. 1967, pp. 965-970.
Gamble, H. S. et al., "Low-Loss CPW Lines on Surface Stabilized High-Resistivity Silicon," IEEE Microwave and Guided Wave Letters, vol. 9, No. 10, Oct. 1999, pp. 395-397.
Huang, Xingyi, et al., "A Review of Dielectric Polymer Composites with High Thermal Conductivity," IEEE Electrical Insulation Magazine, vol. 27, No. 4, Jul./Aug. 2011, pp. 8-16.
Joshi, V. et al., "MEMS Solutions in RF Applications," 2013 IEEE SOI-3D-Subthreshold Microelectronics Technology Unified Conference (S3S), Oct. 2013, IEEE, 2 pages.
Jung, Boo Yang, et al., "Study of FCMBGA with Low CTE Core Substrate," 2009 Electronic Components and Technology Conference, May 2009, pp. 301-304.
Kerr, D.C., et al., "Identification of RF Harmonic Distortion on Si Substrates and Its Reduction Using a Trap-Rich Layer," IEEE Topical Meeting on Silicon Monolithic Integrated Circuits in RF Systems, (SiRF 2008), Jan. 2008, pp. 151-154.
Lederer, D., et al., "New Substrate Passivation Method Dedicated to HR SOI Wafer Fabrication with Increased Substrate Resistivity," IEEE Electron Device Letters, vol. 26, No. 11, Nov. 2005, pp. 805-807.
Lederer, Dimitri et al., "Substrate loss mechanisms for microstrip and CPW transmission lines on lossy silicon wafers," Solid-State Electronics, vol. 47, No. 11, Nov. 2003, pp. 1927-1936.
Lee, Kwang Hong et al., "Integration of III-V materials and Si-CMOS through double layer transfer process," Japanese Journal of Applied Physics, vol. 54, Jan. 2015, pp. 030209-1 to 030209-5.
Lee, Tzung-Yin, et al., "Modeling of SOI FET for RF Switch Applications," IEEE Radio Frequency Integrated Circuits Symposium, May 23-25, 2010, Anaheim, CA, IEEE, pp. 479-482.
Lu, J.Q et al., "Evaluation Procedures for Wafer Bonding and Thinning of Interconnect Test Structures for 3D ICs," Proceedings of the IEEE 2003 International Interconnect Technology Conference, Jun. 2-4, 2003, pp. 74-76.
Mamunya, YE.P., et al., "Electrical and Thermal Conductivity of Polymers Filled with Metal Powders," European Polymer Journal, vol. 38, 2002, pp. 1887-1897.
Mansour, Raafat R., "RF MEMS-CMOS Device Integration," IEEE Microwave Magazine, vol. 14, No. 1, Jan. 2013, pp. 39-56.
Mazuré, C. et al., "Advanced SOI Substrate Manufacturing," 2004 IEEE International Conference on Integrated Circuit Design and Technology, 2004, IEEE, pp. 105-111.
Micak, R. et al., "Photo-Assisted Electrochemical Machining of Micromechanical Structures," Proceedings of Micro Electro Mechanical Systems, Feb. 7-10, 1993, Fort Lauderdale, FL, IEEE, pp. 225-229.
Morris, Art, "Monolithic Integration of RF-MEMS within CMOS," 2015 International Symposium on VLSI Technology, Systems and Application (VLSI-TSA), Apr. 27-29, 2015, IEEE, 2 pages.
Niklaus, F., et al., "Adhesive Wafer Bonding," Journal of Applied Physics, vol. 99, No. 3, 031101 (2006), 28 pages.
Parthasarathy, S., et al., "RF SOI Switch FET Design and Modeling Tradeoffs for GSM Applications," 2010 23rd International Conference on VLSI Design, (VLSID '10), Jan. 2010, pp. 194-199.
Raskin, J.P., et al., "Coupling Effects in High-Resistivity SIMOX Substrates for VHF and Microwave Applications," Proceedings of 1995 IEEE International SOI Conference, Oct. 1995, pp. 62-63.
Notice of Allowance for U.S. Appl. No. 15/287,273, dated Jun. 30, 2017, 8 pages.
Corrected Notice of Allowability for U.S. Appl. No. 15/287,273, dated Jul. 21, 2017, 5 pages.
Supplemental Notice of Allowability for U.S. Appl. No. 15/287,273, dated Sep. 7, 2017, 5 pages.
Extended European Search Report for European Patent Application No. 15184861.1, dated Jan. 25, 2016, 6 pages.
Office Action of the Intellectual Property Office for Taiwanese Patent Application No. 104130224, dated Jun. 15, 2016, 9 pages.
Non-Final Office Action for U.S. Appl. No. 14/885,202, dated Apr. 14, 2016, 5 pages.
Final Office Action for U.S. Appl. No. 14/885,202, dated Sep. 27, 2016, 7 pages.
Advisory Action for U.S. Appl. No. 14/885,202, dated Nov. 29, 2016, 3 pages.

(56) References Cited

OTHER PUBLICATIONS

Notice of Allowance for U.S. Appl. No. 14/885,202, dated Jan. 27, 2017, 7 pages.
Notice of Allowance for U.S. Appl. No. 14/885,202, dated Jul. 24, 2017, 8 pages.
Notice of Allowance for U.S. Appl. No. 14/885,243, dated Aug. 31, 2016, 8 pages.
Non-Final Office Action for U.S. Appl. No. 12/906,689, dated May 27, 2011, 13 pages.
Non-Final Office Action for U.S. Appl. No. 12/906,689, dated Nov. 4, 2011, 20 pages.
Search Report for Japanese Patent Application No. 2011-229152, created on Feb. 22, 2013, 58 pages.
Office Action for Japanese Patent Application No. 2011-229152, drafted May 10, 2013, 7 pages.
Final Rejection for Japanese Patent Application No. 2011-229152, drafted Oct. 25, 2013, 2 pages.
International Search Report and Written Opinion for PCT/US2016/045809, dated Oct. 7, 2016, 11 pages.
Non-Final Office Action for U.S. Appl. No. 15/652,867, dated Oct. 10, 2017, 5 pages.
Bernheim et al., "Chapter 9: Lamination," Tools and Manufacturing Engineers Handbook (book), Apr. 1, 1996, Society of Manufacturing Engineers, p. 9-1.
Fillion R. et al., "Development of a Plastic Encapsulated Multichip Technology for High Volume, Low Cost Commercial Electronics," Electronic Components and Technology Conference, vol. 1, May 1994, IEEE, 5 pages.
Hienawy, Mahmoud AL et al., "New Thermoplastic Polymer Substrate for Microstrip Antennas at 60 GHz," German Microwave Conference, Mar. 15-17, 2010, Berlin, Germany, IEEE, pp. 5-8.
International Search Report and Written Opinion for PCT/US2017/046744, dated Nov. 27, 2017, 17 pages.
International Search Report and Written Opinion for PCT/US2017/046758, dated Nov. 16, 2017, 19 pages.
International Search Report and Written Opinion for PCT/US2017/046779, dated Nov. 29, 2017, 17 pages.
Non-Final Office Action for U.S. Appl. No. 15/616,109, dated Oct. 23, 2017, 16 pages.
Corrected Notice of Allowability for U.S. Appl. No. 14/851,652, dated Oct. 20, 2017, 5 pages.
Final Office Action for U.S. Appl. No. 15/262,457, dated Dec. 19, 2017, 12 pages.
Supplemental Notice of Allowability and Applicant-Initiated Interview Summary for U.S. Appl. No. 15/287,273, dated Oct. 18, 2017, 6 pages.
Supplemental Notice of Allowability for U.S. Appl. No. 15/287,273, dated Nov. 2, 2017, 5 pages.
Non-Final Office Action for U.S. Appl. No. 15/491,064, dated Jan. 2, 2018, 9 pages.
Notice of Allowance for U.S. Appl. No. 14/872,910, dated Nov. 17, 2017, 11 pages.
Notice of Allowance for U.S. Appl. No. 15/648,082, dated Nov. 29, 2017, 8 pages.
Non-Final Office Action for U.S. Appl. No. 15/652,826, dated Nov. 3, 2017, 5 pages.
Notice of Allowance for U.S. Appl. No. 15/229,780, dated Oct. 3, 2017, 7 pages.
Supplemental Notice of Allowability for U.S. Appl. No. 15/287,273, dated Jan. 17, 2018, 5 pages.
Notice of Allowance for U.S. Appl. No. 15/498,040, dated Feb. 20, 2018, 8 pages.
Non-Final Office Action for U.S. Appl. No. 15/387,855, dated Jan. 16, 2018, 7 pages.
Non-Final Office Action for U.S. Appl. No. 15/795,915, dated Feb. 23, 2018, 6 pages.
International Preliminary Report on Patentability for PCT/US2016/045809, dated Feb. 22, 2018, 8 pages.
Advisory Action and Applicant-Initiated Interview Summary for U.S. Appl. No. 15/262,457, dated Feb. 28, 2018, 5 pages.
Supplemental Notice of Allowability for U.S. Appl. No. 15/287,273, dated Feb. 23, 2018, 5 pages.
Non-Final Office Action for U.S. Appl. No. 15/676,415, dated Mar. 27, 2018, 14 page.
Non-Final Office Action for U.S. Appl. No. 15/676,621, dated Mar. 26, 2018, 16 pages.
Notice of Allowance for U.S. Appl. No. 15/795,915, dated Jun. 15, 2018, 7 pages.
Final Office Action for U.S. Appl. No. 15/387,855, dated May 24, 2018, 9 pages.
Non-Final Office Action for U.S. Appl. No. 15/262,457, dated Apr. 19, 2018, 10 pages.
Notice of Allowance for U.S. Appl. No. 15/491,064, dated Apr. 30, 2018, 9 pages.
Non-Final Office Action for U.S. Appl. No. 15/601,858, dated Jun. 26, 2018, 12 pages.
Notice of Allowance for U.S. Appl. No. 15/616,109, dated Jul. 2, 2018, 7 pages.
Notice of Allowance for U.S. Appl. No. 15/676,621, dated Jun. 5, 2018, 8 pages.
Raskin, Jean-Pierre et al., "Substrate Crosstalk Reduction Using SOI Technology," IEEE Transactions on Electron Devices, vol. 44, No. 12, Dec. 1997, pp. 2252-2261.
Bong, B., et al., "Surface-Passivated High-Resistivity Silicon Substrates for RFICs," IEEE Electron Device Letters, vol. 25, No. 4, Apr. 2004, pp. 176-178.
Sherman, Lilli M., "Plastics that Conduct Heat," Plastics Technology Online, Jun. 2001, Retrieved May 17, 2016, http://www.ptonline.com/articles/plastics-that-conduct-heat, Gardner Business Media, Inc., 5 pages.
Tombak, A., et al., "High-Efficiency Cellular Power Amplifiers Based on a Modified LDMOS Process on Bulk Silicon and Silicon-On-Insulator Substrates with Integrated Power Management Circuitry," IEEE Transactions on Microwave Theory and Techniques, vol. 60, No. 6, Jun. 2012, pp. 1862-1869.
Yamanaka, A., et al., "Thermal Conductivity of High-Strength Polyetheylene Fiber and Applications for Cryogenic Use," International Scholarly Research Network, ISRN Materials Science, vol. 2011, Article ID 718761, May 25, 2011, 10 pages.
Non-Final Office Action for U.S. Appl. No. 13/852,648, dated Jul. 18, 2013, 20 pages.
Final Office Action for U.S. Appl. No. 13/852,648, dated Nov. 26, 2013, 21 pages.
Applicant-Initiated Interview Summary for U.S. Appl. No. 13/852,648, dated Jan. 27, 2014, 4 pages.
Advisory Action for U.S. Appl. No. 13/852,648, dated Mar. 7, 2014, 4 pages.
Notice of Allowance for U.S. Appl. No. 13/852,648, dated Jun. 16, 2014, 9 pages.
Notice of Allowance for U.S. Appl. No. 13/852,648, dated Sep. 26, 2014, 8 pages.
Notice of Allowance for U.S. Appl. No. 13/852,648, dated Jan. 22, 2015, 8 pages.
Non-Final Office Action for U.S. Appl. No. 13/852,648, dated Jun. 24, 2015, 20 pages.
Final Office Action for U.S. Appl. No. 13/852,648, dated Oct. 22, 2015, 20 pages.
Non-Final Office Action for U.S. Appl. No. 13/852,648, dated Feb. 19, 2016, 12 pages.
Final Office Action for U.S. Appl. No. 13/852,648, dated Jul. 20, 2016, 14 pages.
Non-Final Office Action for U.S. Appl. No. 14/315,765, dated Jan. 2, 2015, 6 pages.
Final Office Action for U.S. Appl. No. 14/315,765, dated May 11, 2015, 17 pages.
Advisory Action for U.S. Appl. No. 14/315,765, dated Jul. 22, 2015, 3 pages.
Non-Final Office Action for U.S. Appl. No. 14/260,909, dated Mar. 20, 2015, 20 pages.
Final Office Action for U.S. Appl. No. 14/260,909, dated Aug. 12, 2015, 18 pages.
Non-Final Office Action for U.S. Appl. No. 14/261,029, dated Dec. 5, 2014, 15 pages.

(56) References Cited

OTHER PUBLICATIONS

Notice of Allowance for U.S. Appl. No. 14/261,029, dated Apr. 27, 2015, 10 pages.
Corrected Notice of Allowability for U.S. Appl. No. 14/261,029, dated Nov. 17, 2015, 5 pages.
Non-Final Office Action for U.S. Appl. No. 14/529,870, dated Feb. 12, 2016, 14 pages.
Notice of Allowance for U.S. Appl. No. 14/529,870, dated Jul. 15, 2016, 8 pages.
Non-Final Office Action for U.S. Appl. No. 15/293,947, dated Apr. 7, 2017, 12 pages.
Notice of Allowance for U.S. Appl. No. 15/293,947, dated Aug. 14, 2017, 7 pages.
Non-Final Office Action for U.S. Appl. No. 14/715,830, dated Apr. 13, 2016, 16 pages.
Final Office Action for U.S. Appl. No. 14/715,830, dated Sep. 6, 2016, 13 pages.
Advisory Action for U.S. Appl. No. 14/715,830, dated Oct. 31, 2016, 6 pages.
Notice of Allowance for U.S. Appl. No. 14/715,830, dated Feb. 10, 2017, 8 pages.
Notice of Allowance for U.S. Appl. No. 14/715,830, dated Mar. 2, 2017, 8 pages.
Non-Final Office Action for U.S. Appl. No. 14/851,652, dated Oct. 7, 2016, 10 pages.
Notice of Allowance for U.S. Appl. No. 14/851,652, dated Apr. 11, 2017, 9 pages.
Corrected Notice of Allowance for U.S. Appl. No. 14/851,652, dated Jul. 24, 2017, 6 pages.
Corrected Notice of Allowance for U.S. Appl. No. 14/851,652, dated Sep. 6, 2017, 5 pages.
Notice of Allowance for U.S. Appl. No. 14/959,129, dated Oct. 11, 2016, 8 pages.
Non-Final Office Action for U.S. Appl. No. 15/173,037, dated Jan. 10, 2017, 8 pages.
Final Office Action for U.S. Appl. No. 15/173,037, dated May 2, 2017, 13 pages.
Advisory Action for U.S. Appl. No. 15/173,037, dated Jul. 20, 2017, 3 pages.
Notice of Allowance for U.S. Appl. No. 15/173,037, dated Aug. 9, 2017, 7 pages.
Non-Final Office Action for U.S. Appl. No. 15/085,185, dated Feb. 15, 2017, 10 pages.
Non-Final Office Action for U.S. Appl. No. 15/085,185, dated Jun. 6, 2017, 5 pages.
Non-Final Office Action for U.S. Appl. No. 15/229,780, dated Jun. 30, 2017, 12 pages.
Non-Final Office Action for U.S. Appl. No. 15/262,457, dated Aug. 7, 2017, 10 pages.
Notice of Allowance for U.S. Appl. No. 15/408,560, dated Sep. 25, 2017, 8 pages.
Notice of Allowance for U.S. Appl. No. 15/287,202, dated Aug. 25, 2017, 11 pages.
Non-Final Office Action for U.S. Appl. No. 15/353,346, dated May 23, 2017, 15 pages.
Notice of Allowance for U.S. Appl. No. 15/353,346, dated Sep. 25, 2017, 9 pages.
Office Action for Japanese Patent Application No. 2018-526613, dated Nov. 5, 2019, 8 pages.
Notice of Allowance for U.S. Appl. No. 15/873,152, dated Dec. 10, 2019, 9 pages.
Non-Final Office Action for U.S. Appl. No. 16/527,702, dated Jan. 10, 2020, 10 pages.
Fiorenza, et al., "Detailed Simulation Study of a Reverse Embedded-SiGE Strained-Silicon MOSFET," IEEE Transactions on Electron Devices, vol. 55, Issue 2, Feb. 2008, pp. 640-648
Fiorenza, et al., "Systematic study of thick strained silicon NMOSFETs for digital applications," International SiGE Technology and Device Meeting, May 2006, IEEE, 2 pages.

Huang, et al., "Carrier Mobility Enhancement in Strained Si-On-Insulator Fabricated by Wafer Bonding," Symposium on VLSI Technology, Digest of Technical Papers, 2001, pp. 57-58.
Nan, et al., "Effect of Germanium content on mobility enhancement for strained silicon FET," Student Conference on Research and Development, Dec. 2017, IEEE, pp. 154-157.
Sugii, Nobuyuki, et al., "Performance Enhancement of Strained-Si MOSFETs Fabricated on a Chemical-Mechanical-Polished SiGE Substrate," IEEE Transactions on Electron Devices, vol. 49, Issue 12, Dec. 2002, pp. 2237-2243.
Yin, Haizhou, et al., "Fully-depleted Strained-Si on Insulator NMOSFETs without Relaxed SiGe Buffers," International Electron Devices Meeting, Dec. 2003, San Francisco, California, IEEE, 4 pages.
International Search Report and Written Opinion for International Patent Application No. PCT/US2019/034645, dated Sep. 19, 2019, 14 pages.
International Search Report and Written Opinion for International Patent Application No. PCT/US2019/034699, dated Oct. 29, 2019, 13 pages.
Dhar, S. et al., "Electron Mobility Model for Strained-Si Devices," IEEE Transactions on Electron Devices, vol. 52, No. 4, Apr. 2005, IEEE, pp. 527-533.
Notice of Allowance for U.S. Appl. No. 16/038,879, dated Apr. 15, 2020, 9 pages.
Notice of Allowance for U.S. Appl. No. 15/816,637, dated Apr. 2, 2020, 8 pages.
Corrected Notice of Allowability for U.S. Appl. No. 15/695,579, dated Feb. 5, 2020, 5 pages.
Corrected Notice of Allowability for U.S. Appl. No. 15/695,579, dated Apr. 1, 2020, 4 pages.
Notice of Allowance for U.S. Appl. No. 16/527,702, dated Apr. 9, 2020, 8 pages.
Decision of Rejection for Japanese Patent Application No. 2015-180657, dated Mar. 17, 2020, 4 pages.
Intention to Grant for European Patent Application No. 17757646.9, dated Feb. 27, 2020, 55 pages.
International Search Report and Written Opinion for International Patent Application No. PCT/US2019/063460, dated Feb. 25, 2020, 14 pages.
International Search Report and Written Opinion for International Patent Application No. PCT/US2019/055317, dated Feb. 6, 2020, 17 pages.
International Search Report and Written Opinion for International Patent Application No. PCT/US2019/055321, dated Jan. 27, 2020, 23 pages.
Notice of Allowance for U.S. Appl. No. 16/703,251, dated Aug. 27, 2020, 8 pages.
Notice of Allowance for U.S. Appl. No. 16/454,687, dated Aug. 14, 2020, 7 pages.
Final Office Action for U.S. Appl. No. 16/454,809, dated Aug. 21, 2020, 12 pages.
Advisory Action for U.S. Appl. No. 16/454,809, dated Oct. 23, 2020, 3 pages.
Decision to Grant for Japanese Patent Application No. 2018-526613, dated Aug. 17, 2020, 5 pages.
International Preliminary Report on Patentability for International Patent Application No. PCT/US2019/025591, dated Oct. 15, 2020, 6 pages.
Welser, J. et al., "Electron Mobility Enhancement in Strained-Si N-Type Metal-Oxide-Semiconductor Field-Effect Transistors," IEEE Electron Device Letters, vol. 15, No. 3, Mar. 1994, IEEE, pp. 100-102.
Examination Report for European Patent Application No. 16751791.1, dated Apr. 30, 2020, 15 pages.
Notification of Reasons for Refusal for Japanese Patent Application No. 2018-526613, dated May 11, 2020, 6 pages.
Examination Report for Singapore Patent Application No. 11201901193U, dated May 26, 2020, 6 pages.
International Search Report and Written Opinion for International Patent Application No. PCT/US2020/014662, dated May 7, 2020, 18 pages.

(56) References Cited

OTHER PUBLICATIONS

International Search Report and Written Opinion for International Patent Application No. PCT/US2020/014665, dated May 13, 2020, 17 pages.
International Search Report and Written Opinion for International Patent Application No. PCT/US2020/014666, dated Jun. 4, 2020, 18 pages.
International Search Report and Written Opinion for International Patent Application No. PCT/US2020/014667, dated May 18, 2020, 14 pages.
International Search Report and Written Opinion for International Patent Application No. PCT/US2020/014669, dated Jun. 4, 2020, 15 pages.
Quayle Action for U.S. Appl. No. 16/703,251, dated Jun. 26, 2020, 5 pages.
Notice of Allowance for U.S. Appl. No. 15/873,152, dated May 11, 2020, 8 pages.
Corrected Notice of Allowability for U.S. Appl. No. 15/695,579, dated May 20, 2020, 4 pages.
Notice of Allowability for U.S. Appl. No. 15/695,579, dated Jun. 25, 2020, 4 pages.
Notice of Allowance for U.S. Appl. No. 16/004,961, dated Apr. 30, 2020, 8 pages.
Notice of Allowance for U.S. Appl. No. 16/368,210, dated Jun. 17, 2020, 10 pages.
Non-Final Office Action for U.S. Appl. No. 16/374,125, dated Jun. 26, 2020, 12 pages.
Non-Final Office Action for U.S. Appl. No. 16/390,496, dated Jul. 10, 2020, 17 pages.
Non-Final Office Action for U.S. Appl. No. 16/454,687, dated May 15, 2020, 14 pages.
Non-Final Office Action for U.S. Appl. No. 16/454,809, dated May 15, 2020, 12 pages.
Supplementary Examination Report for Singapore Patent Application No. 11201901194S, dated Mar. 10, 2021, 3 pages.
International Preliminary Report on Patentability for International Patent Application No. PCT/US2019/055317, dated Apr. 22, 2021, 11 pages.
International Preliminary Report on Patentability for International Patent Application No. PCT/US2019/055321, dated Apr. 22, 2021, 14 pages.
Office Action for Taiwanese Patent Application No. 108140788, dated Mar. 25, 2021, 18 pages.
Notice of Allowance for U.S. Appl. No. 16/527,702, dated Nov. 13, 2020, 8 pages.
Notice of Allowance for U.S. Appl. No. 16/374,125, dated Dec. 16, 2020, 9 pages.
Final Office Action for U.S. Appl. No. 16/390,496, dated Dec. 24, 2020, 21 pages.
Non-Final Office Action for U.S. Appl. No. 16/426,527, dated Nov. 20, 2020, 7 pages.
Notice of Allowance for U.S. Appl. No. 16/454,809, dated Nov. 25, 2020, 8 pages.
Non-Final Office Action for U.S. Appl. No. 16/427,019, dated Nov. 19, 2020, 19 pages.
First Office Action for Chinese Patent Application No. 201680058198.6, dated Dec. 29, 2020, 14 pages.
International Preliminary Report on Patentability for International Patent Application No. PCT/US2019/034645, dated Jan. 14, 2021, 9 pages.
Advisory Action for U.S. Appl. No. 16/390,496, dated Mar. 1, 2021, 3 pages.
Notice of Allowance for U.S. Appl. No. 16/390,496, dated Apr. 5, 2021, 7 pages.
Non-Final Office Action for U.S. Appl. No. 16/678,551, dated Apr. 7, 2021, 9 pages.
Non-Final Office Action for U.S. Appl. No. 16/678,573, dated Feb. 19, 2021, 11 pages.
Non-Final Office Action for U.S. Appl. No. 16/678,602, dated Feb. 19, 2021, 10 pages.
Applicant-Initiated Interview Summary for U.S. Appl. No. 16/678,573, dated May 7, 2021, 2 pages.
Notice of Allowance for U.S. Appl. No. 16/426,527, dated May 14, 2021, 9 pages.
Final Office Action for U.S. Appl. No. 16/427,019, dated May 21, 2021, 16 pages.
Final Office Action for U.S. Appl. No. 16/678,602, dated Jun. 1, 2021, 9 pages.
International Preliminary Report on Patentability for International Patent Application No. PCT/US2019/063460, dated Jun. 10, 2021, 9 pages.
Final Office Action and Examiner-Initiated Interview Summary for U.S. Appl. No. 16/678,551, dated Jun. 28, 2021, 9 pages.
Final Office Action and Examiner-Initiated Interview Summary for U.S. Appl. No. 16/678,573, dated Jun. 28, 2021, 10 pages.
Notice of Allowance for U.S. Appl. No. 16/678,619, dated Jul. 8, 2021, 10 pages.
Notice of Reasons for Refusal for Japanese Patent Application No. 2020119130, dated Jun. 29, 2021, 4 pages.
Notice of Reasons for Rejection for Japanese Patent Application No. 2019507765, dated Jun. 28, 2021, 4 pages.
Search Report for Japanese Patent Application No. 2019507768, dated Jul. 15, 2021, 42 pages.
Notice of Reasons for Refusal for Japanese Patent Application No. 2019507768, dated Jul. 26, 2021, 4 pages.
Reasons for Rejection for Japanese Patent Application No. 2019507767, dated Jun. 25, 2021, 5 pages.

* cited by examiner

THERMALLY ENHANCED SEMICONDUCTOR PACKAGE WITH AT LEAST ONE HEAT EXTRACTOR AND PROCESS FOR MAKING THE SAME

FIELD OF THE DISCLOSURE

The present disclosure relates to a package and a process for making the same, and more particularly to a thermally enhanced package, and a process to apply at least one heat extractor into the package for enhanced thermal performance.

BACKGROUND

With the current popularity of portable communication devices and developed fabrication technology, high speed and high performance transistors are more densely integrated on device modules. Consequently, the amount of heat generated by the device modules will increase significantly due to the large number of transistors integrated on the device modules, the large amount of power passing through the transistors, and the high operation speed of the transistors. Accordingly, it is desirable to package the device modules in a configuration for better heat management.

Conventionally, these high-power device modules may reside directly over heat sinks for heat evacuation. However, such assemblies are not attractive for the low profile applications. In some applications, the heat sinks may be embedded in a printed circuit board (PCB). A superior thermal conductance between the high-power device modules and the heat sinks within the PCB is required. Furthermore, the heat sinks embedded in the PCB may block electrical routing in the PCB to ensure the thermal sinking capability.

To accommodate the increased heat generation of the device modules, it is therefore an object of the present disclosure to provide an improved package design with enhanced thermal performance. Further, there is also a need to enhance the performance of the device modules without increasing the package size or sacrificing the electrical performance.

SUMMARY

The present disclosure relates to a thermally enhanced package, and a process for making the same. The disclosed thermally enhanced package includes a carrier having a top surface, a first thinned die, a first mold compound, and a first heat extractor. The first thinned die includes a first device layer over the top surface of the carrier and a first dielectric layer over the first device layer. The first mold compound resides on the top surface of the carrier, surrounds the first thinned die, and extends beyond a top surface of the first thinned die to define a first opening within the first mold compound and over the first thinned die. Herein, the first mold compound does not reside over the first thinned die and provides vertical walls of the first opening, which are aligned with edges of the first thinned die in both X-direction and Y-direction. The X-direction and the Y-direction are parallel to the top surface of the carrier, and the X-direction and the Y-direction are orthogonal to each other. The top surface of the first thinned die is at a bottom of the first opening. In addition, at least a portion of the first heat extractor is inserted into the first opening and in thermal contact with the first thinned die. The first heat extractor is formed of a metal or an alloy.

In one embodiment of the thermally enhanced package, a top surface of the first dielectric layer is the top surface of the first thinned die.

In one embodiment of the thermally enhanced package, the first heat extractor is attached to the first thinned die via an attach layer, which is formed of thermal conductive epoxies, thermal conductive silicones, or alumina thermal adhesives.

In one embodiment of the thermally enhanced package, the first heat extractor has both an X-direction dimension and a Y-direction dimension essentially the same as the first thinned die.

In one embodiment of the thermally enhanced package, the first heat extractor fully fills the first opening. A top surface of the first heat extractor and a top surface of the first mold compound are essentially at a same plane.

In one embodiment of the thermally enhanced package, the top surface of the first heat extractor is lower than the top surface of the first mold compound.

According to another embodiment, the thermally enhanced package further includes a second heat extractor. Herein, at least a portion of the second heat extractor is inserted in the first opening and over the first heat extractor. The second heat extractor, the first heat extractor, and the first thinned die are thermally connected.

In one embodiment of the thermally enhanced package, the second heat extractor is attached to the first heat extractor via an attach layer, which is formed of thermal conductive epoxies, thermal conductive silicones, or alumina thermal adhesives.

In one embodiment of the thermally enhanced package, the first thinned die further includes a number of interconnects extending from a bottom surface of the first device layer to the top surface of the carrier.

According to another embodiment, the thermally enhanced package further includes an underfilling layer, which resides between the first mold compound and the top surface of the carrier, and underfills the first thinned die between the bottom surface of the first device layer and the top surface of the carrier. The underfilling layer is formed from a same material as the first mold compound.

In one embodiment of the thermally enhanced package, the carrier includes a number of antenna patches at a bottom surface of the carrier. Each antenna patch is electrically connected to a corresponding interconnect.

In one embodiment of the thermally enhanced package, the carrier is one of a laminate carrier, a wafer level fan out (WLFO) carrier, a wafer level fan in (WLFI) carrier, a lead frame, and a ceramic carrier.

According to another embodiment, the thermally enhanced package further includes a second thinned die with a second device layer over the top surface of the carrier and a second dielectric layer over the second device layer. Herein, the first mold compound surrounds the second thinned die, and extends beyond a top surface of the second thinned die to define a second opening within the first mold compound and over the second thinned die. The first mold compound does not reside over the second thinned die and provides vertical walls of the first opening, which are aligned with edges of the second thinned die in both the X-direction and the Y-direction. The top surface of the second thinned die is at a bottom of the second opening. A first portion of the first heat extractor is inserted in the first opening and in thermal contact with the first thinned die, and a second portion of the first heat extractor is inserted in the second opening and in thermal contact with the second thinned die. The first heat extractor has a multi-finger comb-structure.

In one embodiment of the thermally enhanced package, the carrier includes a number of carrier contacts at the top surface of the carrier. Each interconnect is electrically connected to a corresponding carrier contact.

According to another embodiment, the thermally enhanced package further includes at least one through mold via (TMV), which is electrically connected to the first thinned die via a corresponding carrier contact and extends through the first mold compound from a bottom surface of the first mold compound to a top surface of the first mold compound.

According to another embodiment, the thermally enhanced package is included in a system assembly. Beside the thermally enhanced package, the system assembly further includes a printed circuit board (PCB) with at least one board contact on a bottom surface of the PCB. Herein, the bottom surface of the PCB is over the top surface of the first mold compound, and the at least one TMV is electrically connected to the at least one board contact via at least one solder pad or at least one solder ball.

In one embodiment of the system assembly, the PCB further includes a heat sink structure on the bottom surface of the PCB. The heat sink structure is in thermal contact with the first heat extractor in the thermally enhanced package.

According to another embodiment, the thermally enhanced package further includes a second mold compound, which is formed over the first mold compound and encapsulates the first heat extractor. Herein, the at least one TMV extends through the first mold compound and the second mold compound. There is at least one solder pad or at least one solder ball formed over the second mold compound and electrically connected to the at least one TMV.

According to an exemplary process, a precursor package, which includes a carrier, a first die attached to a top surface of the carrier, and a first mold compound, is provided. The first mold compound is formed over the top surface of the carrier and encapsulates the first die. Herein, the first die includes a first device layer, a first dielectric layer over the first device layer, and a first die substrate over the first dielectric layer. The first mold compound is then thinned down to expose a backside of the first die substrate. Next, the entire first die substrate is removed to create a first opening within the first mold compound and provide a first thinned die. The first opening is formed over the first thinned die, and a top surface of the first thinned die is at a bottom of the first opening. Finally, at least a portion of a heat extractor, which is formed of a metal, is inserted into the first opening, such that the heat extractor is in thermal contact with the first thinned die.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
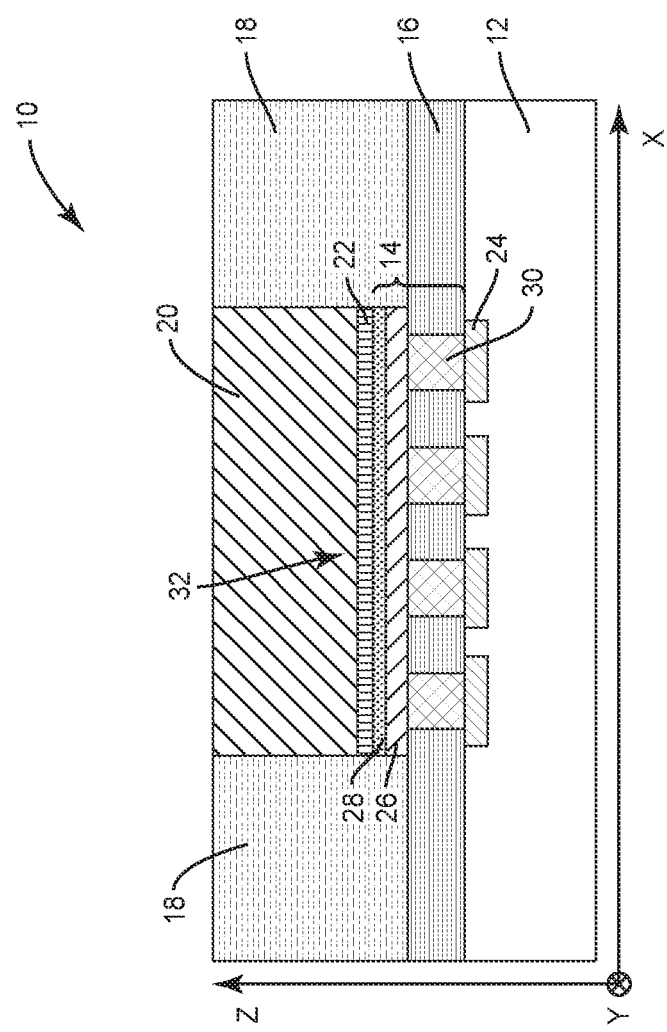
FIG. 1 shows an exemplary thermally enhanced package according to one embodiment of the present disclosure.

FIGS. 9A-9E provide exemplary steps that illustrate a process to fabricate the exemplary thermally enhanced package shown in FIG. 1.

It will be understood that for clear illustrations, FIGS. 1-9E may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a thermally enhanced package, and a process for making the same. FIG. 1 shows an exemplary thermally enhanced package 10 according to one embodiment of the present disclosure. For the purpose of this illustration, the exemplary thermally enhanced package 10 includes a carrier 12, a first thinned die 14, an underfilling layer 16, a first mold compound component 18, a first heat extractor 20, and a first attach layer 22. In different applications, the thermally enhanced package 10 may include multiple thinned dies.

In detail, the carrier 12 may be a laminate carrier, a wafer level fan out (WLFO) carrier, a wafer level fan in (WLFI) carrier, a lead frame, or a ceramic carrier, or the like. The carrier 12 includes a number of first carrier contacts 24 (only one first carrier contact is labeled with a reference number for clarity) formed at a top surface of the carrier 12 and configured to electrically connect to the first thinned die 14. The first thinned die 14 includes a first device layer 26, a first dielectric layer 28 over a top surface of the first device layer 26, and a number of first interconnects 30 (only one first interconnect is labeled with a reference number for clarity) extending from a bottom surface of the first device layer 26 to the top surface of the carrier 12. Herein, each first interconnect 30 is electrically connected to a corresponding first carrier contact 24. The first device layer 26 with a thickness between 10 nm and 20000 nm may be formed of silicon oxide, gallium arsenide, gallium nitride, silicon germanium, or the like. The first dielectric layer 28 with a thickness between 10 nm and 20000 nm may be formed of silicon oxide, silicon nitride, or aluminum nitride. The first interconnects 30 with a height between 5 μm and 200 μm may be copper pillar bumps, solder ball bumps, or the like.

In one embodiment, the first thinned die 14 may be formed from a silicon-on-insulator (SOI) structure, which refers to a structure including a silicon substrate, a silicon epitaxy layer, and a buried oxide (BOX) layer sandwiched between the silicon substrate and the silicon epitaxy layer. The first device layer 26 of the first thinned die 14 is formed by integrating electronic components (not shown) in or on the silicon epitaxy layer of the SOI structure. The first dielectric layer 28 of the first thinned die 14 is the BOX layer of the SOI structure. In addition, the silicon substrate of the SOI structure is removed substantially to complete the first thinned die 14 (more details in the following discussion). In some applications, a top surface of the first thinned die 14 may be a top surface of the first dielectric layer 28.

The underfilling layer 16 resides over the top surface of the carrier 12, such that the underfilling layer 16 encapsulates the first interconnects 30 and underfills the first thinned die 14 between the bottom surface of the first device layer 26 and the top surface of the carrier 12. The underfilling layer 16 may be formed from conventional polymeric compounds, which serve to mitigate the stress effects caused by Coefficient of Thermal Expansion (CTE) mismatch between the first thinned die 14 and the carrier 12.

The first mold compound component 18 resides over the underfilling layer 16, surrounds the first thinned die 14, and extends beyond the top surface of the first thinned die 14 to define a first opening 32 within the first mold compound 18 and over the first thinned die 14. The top surface of the first thinned die 14 is at a bottom of the first opening 32. Herein, the first mold compound 18 does not reside over the first thinned die 14 and provides vertical walls of the first opening 32 in Z-direction. The vertical walls of the first opening 32 are well aligned with edges of the first thinned die 14 in both X-direction and Y-direction. Herein, the X-direction and the Y-direction are parallel to the top surface of the carrier 12, and the Z-direction is perpendicular to the top surface of the carrier 12. The X-direction, the Y-direction, and the Z-direction are all orthogonal to each other. The first mold compound 18 may be formed from a same or different material as the underfilling layer 16. When the first mold compound 18 and the underfilling layer 16 are formed from a same material, the first mold compound 18 and the underfilling layer 16 may be formed simultaneously. One exemplary material used to form the first mold compound 18 is an organic epoxy resin system.

In addition, at least a portion of the first heat extractor 20 is inserted into the first opening 32 and attached to the top surface of the first thinned die 14 via the first attach layer 22. The first heat extractor 20 may be a metal slug that has a large thermal radiating area. The first heat extractor 20 may be formed of copper, aluminum/aluminum alloys, brass, or other metals or alloys that have a high thermal conductivity. The first attach layer 22 may be formed of thermal adhesives or thermal greases, such as thermal conductive epoxies, thermal conductive silicones, alumina thermal adhesives or other materials that can intermediate the thermal interface between the first thinned die 14 and the first heat extractor 20. Various viscosities, hardnesses, and cure speed specifications of the first attach layer 22 are available. As such, the first heat extractor 20 is in thermal contact with the first thinned die 14, and configured to absorb heat generated from the first thinned die 14. For the purpose of this illustration, the first heat extractor 20 has both an X-direction dimension and a Y-direction dimension essentially the same as the first thinned die 14, and the first heat extractor 20 has a thickness (in Z-direction dimension) essentially the same as a depth of the first opening 32. Herein, essentially the same refers to between 95% and 100%. In detail, the X-direction dimension of the first heat extractor 20 may be between 95% and 100% of the X-direction dimension of the first thinned die 14, and the Y-direction dimension of the first heat extractor 20 may be between 95% and 100% of the Y-direction dimension of the first thinned 14. As such, the first heat extractor 20 fully fills the first opening 32, and a top surface of the first heat extractor 20 and a top surface of the first mold compound 18 are essentially at a same plane. In different applications, the thickness of the first heat extractor 20 may be different from the depth of the first opening 32, such that the top surface of the first heat extractor 20 may be lower or higher than the top surface of the first mold compound 18 (not shown here).

Figure 2:
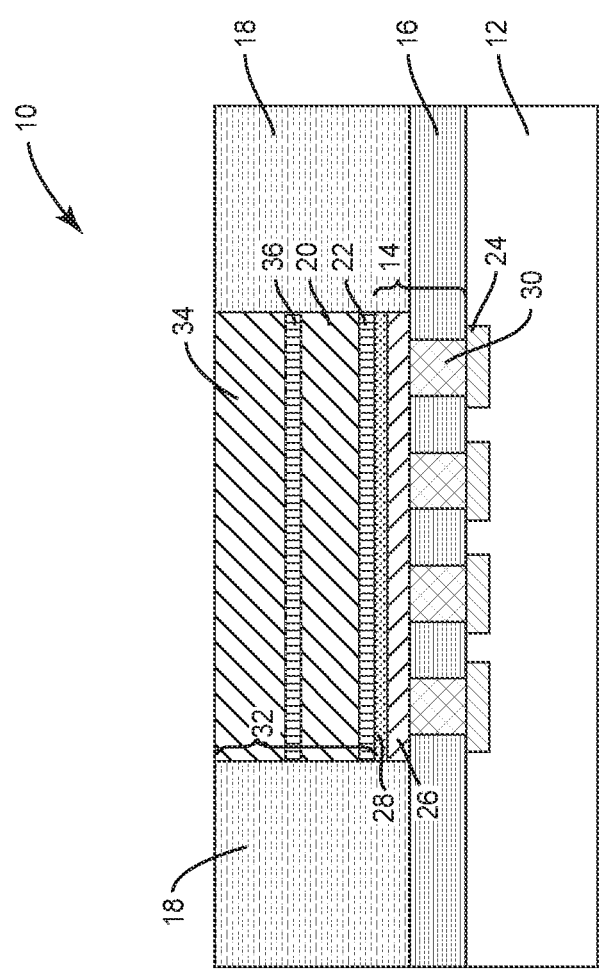
FIGS. 2-8 shows an alternative thermally enhanced package according to one embodiment of the present disclosure.

In these cases where the thickness of the first heat extractor 20 is shorter than the depth of the first opening 32, the thermally enhanced package 10 may further include a second heat extractor 34 and a second attach layer 36, as illustrated in FIG. 2. Herein, the first heat extractor 20 resides within a lower region of the first opening 32, and at least a portion of the second heat extractor 34 is inserted into an upper region of the first opening 32 and attached to the top surface of the first heat extractor 20 via the second attach layer 36. The second heat extractor 34 may be a metal slug that has a large thermal radiating area. The second heat extractor 34 may be formed of copper, aluminum/aluminum alloys, brass, or other metals or alloys that have a high thermal conductivity. The second attach layer 36 may be formed of thermal adhesives or thermal greases, such as thermal conductive epoxies, thermal conductive silicones, alumina thermal adhesives, or other materials that can intermediate the thermal interface between the first heat extractor 20 and the second heat extractor 34. Various viscosities, hardnesses, and cure speed specifications of the second attach layer 36 are available. Herein, the second heat extractor 34, the first heat extractor 20, and the first thinned die 14 are thermally connected. A combination of the first heat extractor 20 and the second heat extractor 34 is configured to absorb heat generated from the first thinned die 14. For the purpose of this illustration, the second heat extractor 36 has both an X-direction dimension and a Y-direction dimension essentially the same as the first thinned die 14. A combined thickness of the first heat extractor 20 and the second heat extractor 36 is essentially the same as the depth of the first opening 32. As such, a top surface of the second heat extractor 34 and the top surface of the first mold compound 18 are essentially at a same plane.

Figure 3:
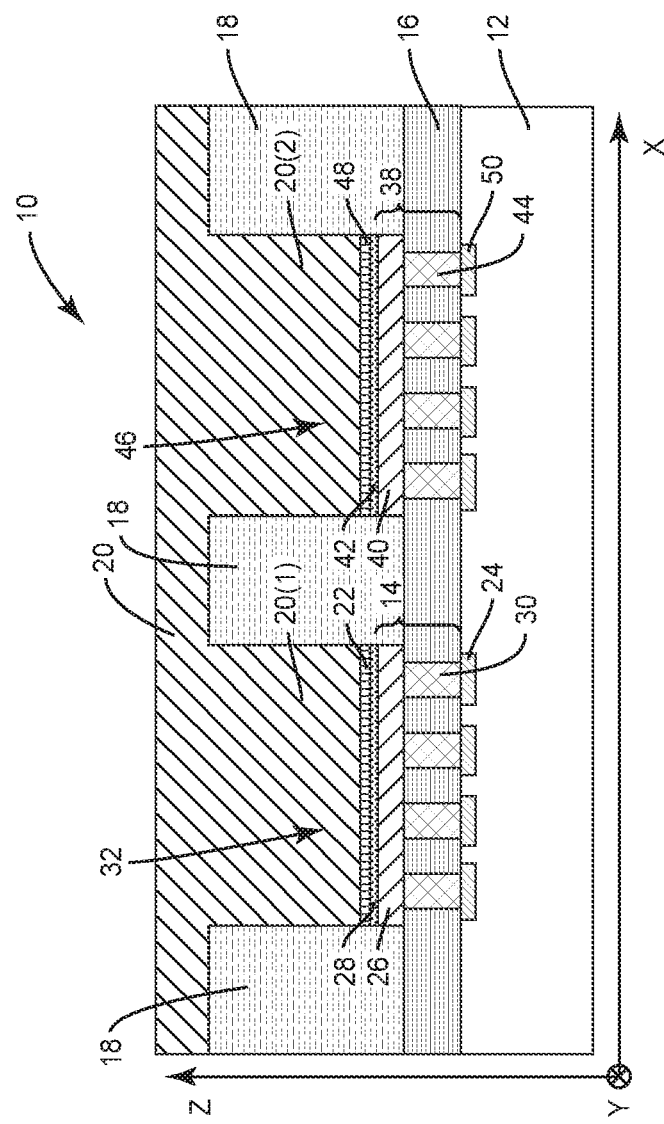

In some applications, the thermally enhanced package 10 includes multiple thinned dies, as illustrated in FIG. 3. Herein, besides the first thinned die 14, the thermally enhanced package 10 also includes a second thinned die 38. The second thinned die 38 includes a second device layer 40, a second dielectric layer 42 over a top surface of the second device layer 40, and a number of second interconnects 44 (only one second interconnect is labeled with a reference number for clarity) extending from a bottom surface of the second device layer 40 to the top surface of the carrier 12. The second device layer 40 with a thickness between 10 nm and 20000 nm may be formed of silicon oxide, gallium arsenide, gallium nitride, silicon germanium, or the like. The second dielectric layer 42 with a thickness between 10 nm and 20000 nm may be formed of silicon oxide, silicon nitride, or aluminum nitride. The second interconnects 44 with a height between 5 μm and 200 μm may be copper pillar bumps, solder ball bumps, or the like.

The underfilling layer 16 encapsulates the second interconnects 44 and underfills the second thinned die 38 between the bottom surface of the second device layer 40 and the top surface of the carrier 12. The first mold compound 18 resides over the underfilling layer 16, surrounds the second thinned die 38, and extends beyond a top surface of the second thinned die 38 to define a second opening 46 within the first mold compound 18. The second opening 46 is over the second thinned die 38 and the top surface of the second thinned die 38 is at a bottom of the second opening 46. Herein, the first mold compound 18 does not reside over the second thinned die 38 and provides vertical walls of the second opening 46 in the Z-direction. The vertical walls of the second opening 46 are well aligned with edges of the second thinned die 38 in both the X-direction and the Y-direction.

In this embodiment, a first portion of the first heat extractor 20-1 is inserted in the first opening 32 and in thermal contact with the first thinned die 14, and a second portion of the first heat extractor 20-2 is inserted in the second opening 46 and in thermal contact with the second thinned die 38. The first heat extractor 20 may have a "multi-finger comb-structure" (also described in some cases as a combined-T shape). Notice that the first heat extractor 20 may be a metal slug, a metal comb, or other suitable structures that have a large thermal radiating area. The first portion of the first heat extractor 20-1 is attached to the top surface of the first thinned die 14 via the first attach layer 22, and the second portion of the first heat extractor 20-2 is attached to the top surface of the second thinned die 38 via a third attach layer 48. The third attach layer 48 may be formed of thermal adhesives or thermal greases, such as thermal conductive epoxies, thermal conductive silicones, alumina thermal adhesives or other materials that can intermediate the thermal interface between the second thinned die 38 and the second portion of the first heat extractor 20-2. Various viscosities, hardnesses, and cure speed specifications of the third attach layer 48 are available. The first portion of the first heat extractor 20-1 is configured to absorb heat generated from the first thinned die 14, while the second portion of the first heat extractor 20-2 is configured to absorb heat generated from the second thinned die 38.

Furthermore, the carrier 12 also includes a number of second carrier contacts 50 (only one second carrier contact is labeled with a reference number for clarity), which are formed at the top surface of the carrier 12 and configured to electrically connect to the second thinned die 38. Each second interconnect 44 is electrically connected to a corresponding second carrier contact 50.

In one embodiment, the second thinned die 38 may be formed from a silicon-on-insulator (SOI) structure. The second device layer 40 of the second thinned die 38 is formed by integrating electronic components (not shown) in or on the silicon epitaxy layer of the SOI structure. The second dielectric layer 42 of the second thinned die 38 is the BOX layer of the SOI structure. In addition, the silicon substrate of the SOI structure is removed substantially to complete the second thinned die 38. In some applications, a top surface of the second thinned die 38 is a top surface of the second dielectric layer 42.

Figure 4:
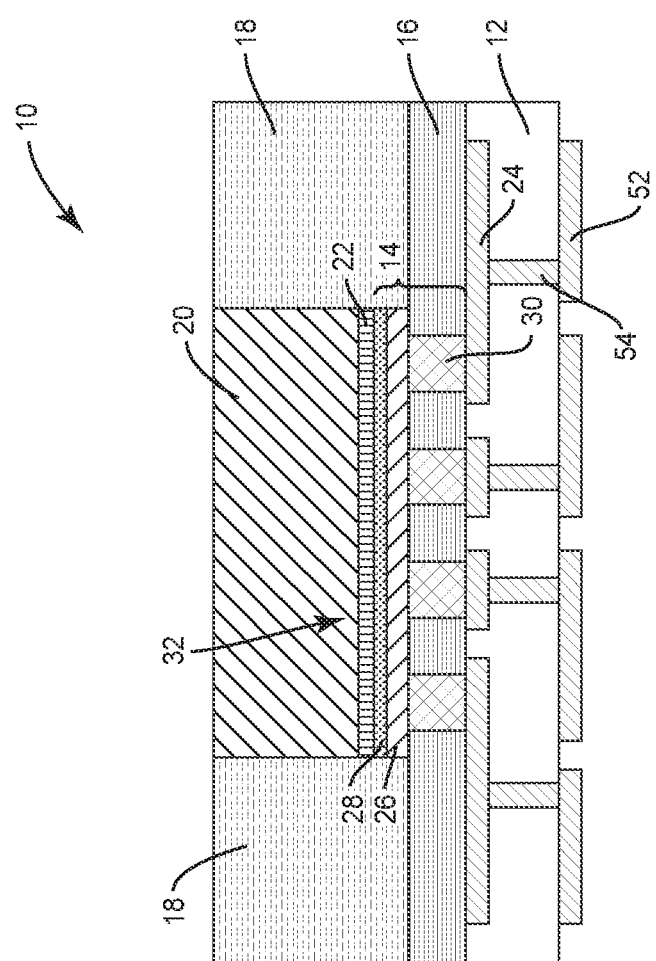

In some applications, the carrier 12 may further include a number of antenna patches 52 at a bottom surface of the carrier 12 to provide an antenna array, as illustrated in FIG. 4. Herein, each antenna patch 52 may be electrically connected to a corresponding first carrier contact 24 by one carrier via 54 (only one antenna patch and one carrier via are labeled with reference numbers for clarity). Consequently, each antenna patch 52 is electrically connected to the first thinned die 14. The antenna patches 52 formed at the bottom surface of the carrier 12 ensures a minimal length for the interconnection between the first thinned die 14 and the antenna array. The antenna patches 52 may be formed of metal plates, built out of copper, aluminum/aluminum alloys, TLCC materials, or other metals or alloys that have a high electrical conductivity for low insertion loss. If the carrier 12 is a WLFO carrier or a WLFO carrier, the first carrier contacts 24, the carrier vias 54, and the antenna patches 52 may be realized when redistribution layers (RDL) are formed in the carrier 12.

Figure 5:
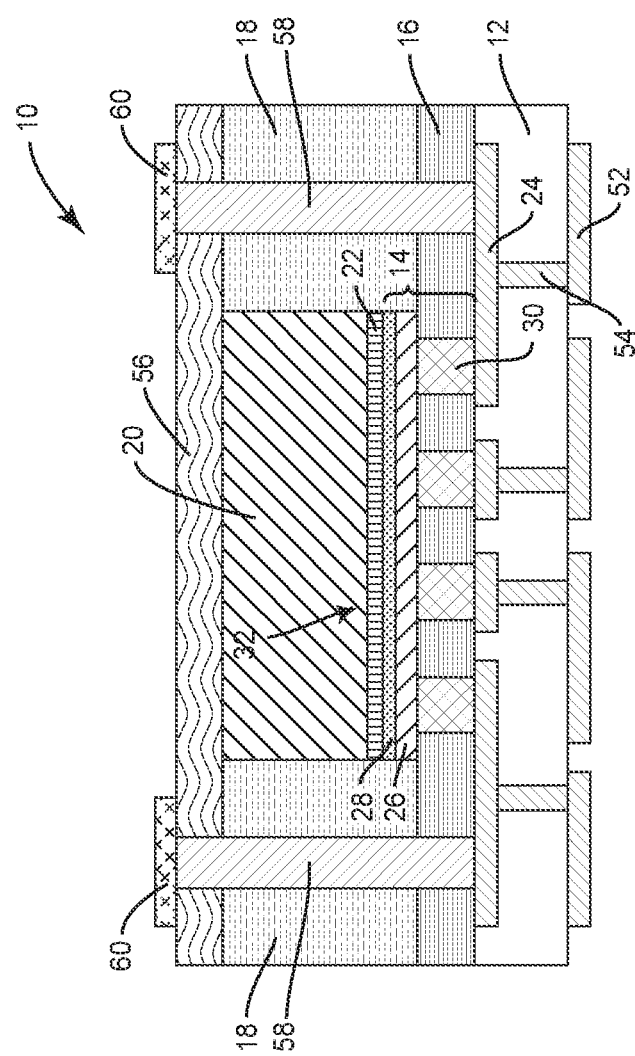
Figure 6:
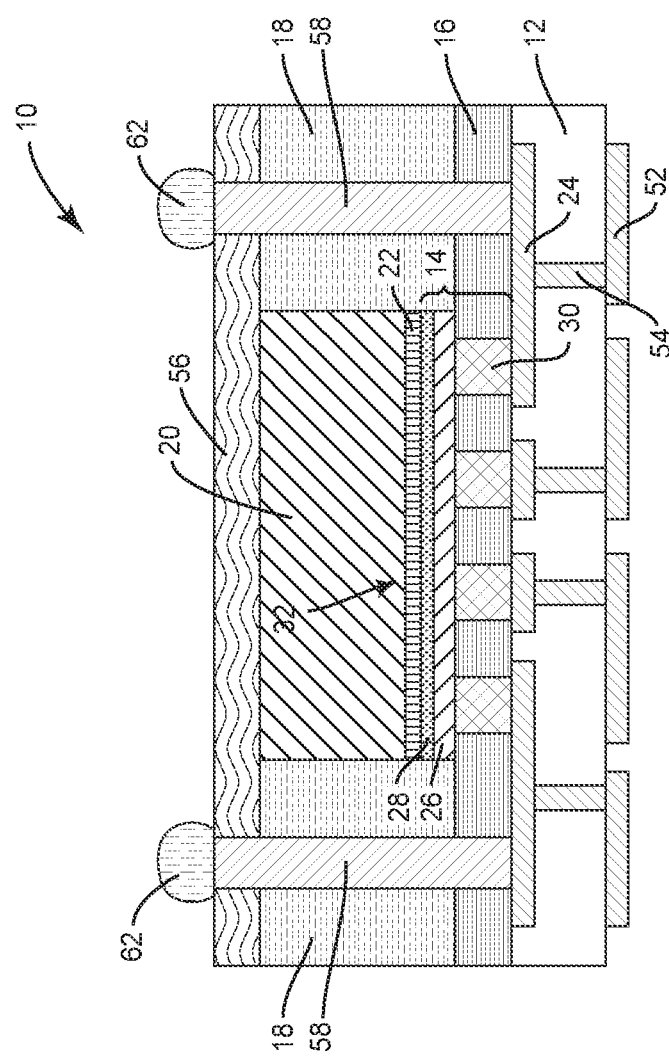

FIGS. 5 and 6 show that the thermally enhanced package 10 further includes a second mold compound 56 to close the first heat extractor 20. The second mold compound 56 is formed over the first mold compound 18 and the first opening 32. Regardless of the thickness of the first heat extractor 20 (the top surface of the first heat extractor 20 may be higher than, lower than, or at a same plane level as the top surface of the first mold compound 18), the second mold compound 56 completely encapsulates and directly connects to the first heat extractor 20. The second mold compound 56 is a high thermal conductivity mold compound. Compared to the normal mold compound having 1 w/m·k thermal conductivity, a high thermal conductivity mold compound has 2.5 w/m·k~10 w/m·k or greater thermal conductivity. The second mold compound 56 may be formed of thermoplastics or thermoset materials, such as PPS (poly phenyl sulfide), overmold epoxies doped with boron nitride or alumina thermal additives, or the like. The second mold compound 56 may be formed of a same or different material as the first mold compound 18. However, unlike the second mold compound 56, the first mold compound 18 does not have thermal conductivity requirements.

In addition, the thermally enhanced package 10 may further include one or more through mold vias (TMVs) 58, which provide electric connectivity to the first thinned die 14. Each TMV 58 is electrically connected to the first thinned die 14 via a corresponding first carrier contact 24, and extends through the underfilling layer 16, the first mold compound 18, and the second mold compound 56. If the carrier 12 includes the antenna patches 52, the TMVs 58 may electrically connected to the antenna patches 52. There may be solder pads 60 (FIG. 5) or solder balls 62 (FIG. 6) formed over the second mold compound 56 and electrically connected to the corresponding TMVs 58.

Figure 7:
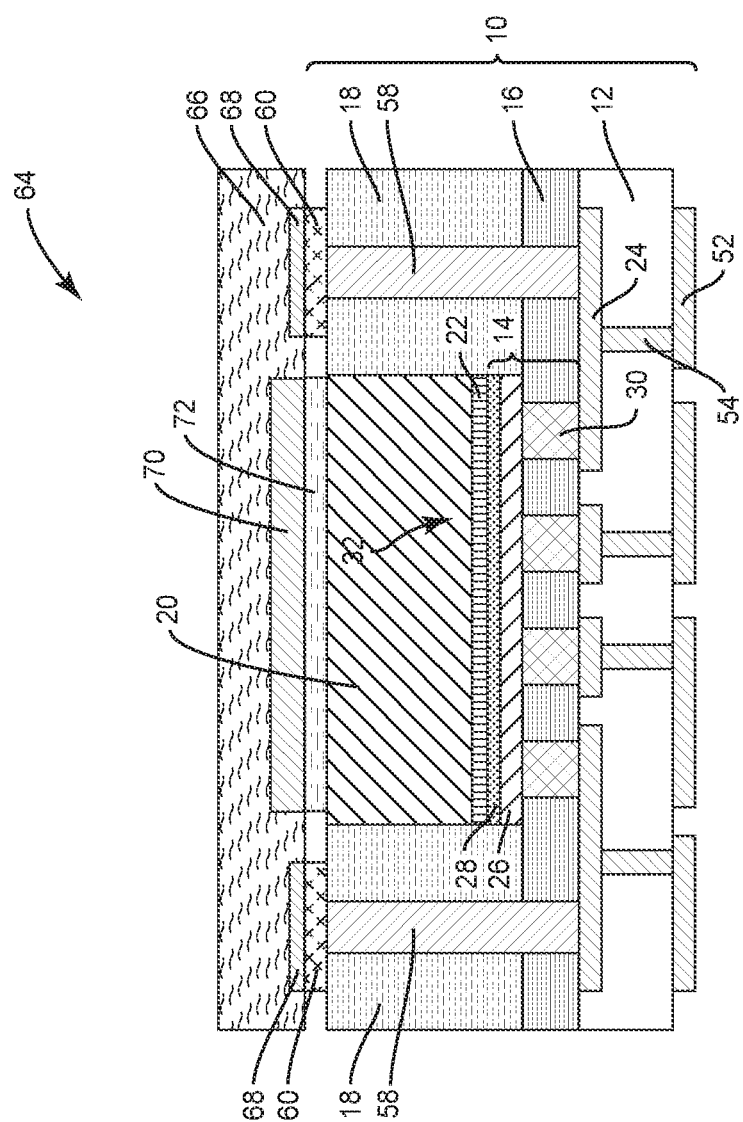
Figure 8:
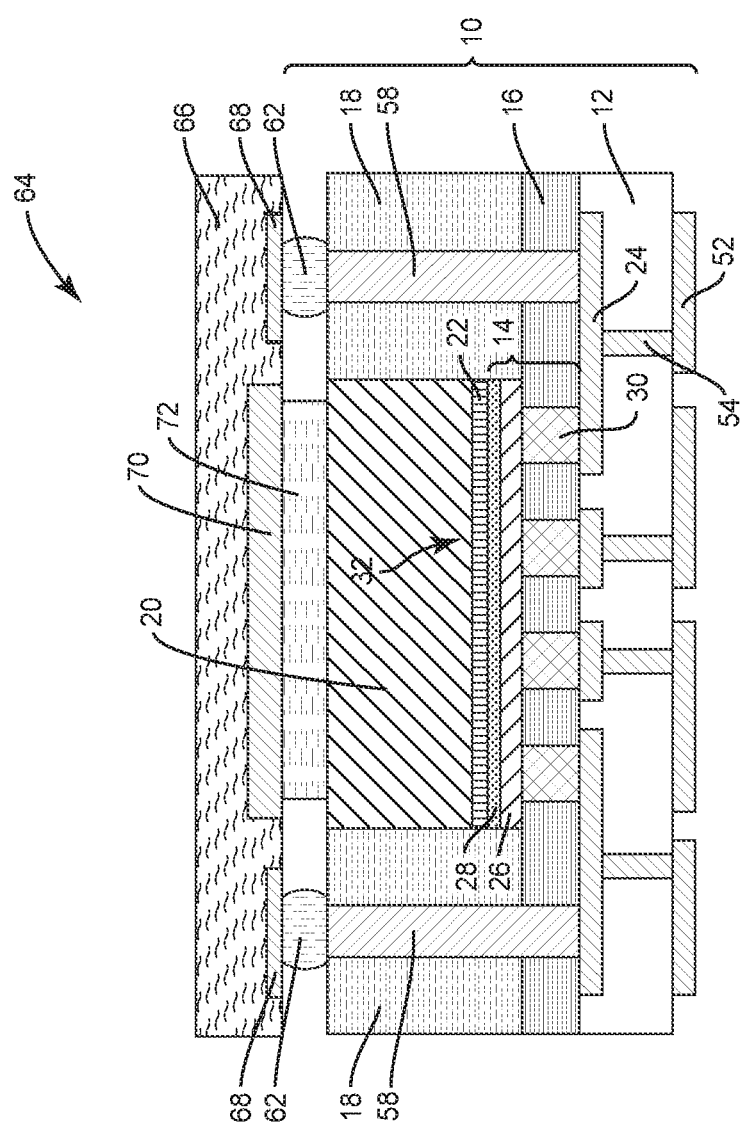

FIG. 7 shows a system assembly 64 including the thermally enhanced package 10. In this embodiment, the thermally enhanced package 10 may not include the second mold compound 56 to encapsulate the first heat extractor 20, such that the TMVs 58 only extend through the underfilling layer 16 and the first mold compound 18. Each solder pad 60 is formed over the first mold compound 18 and electrically connected to the corresponding TMV 58. Besides the thermally enhanced package 10, the system assembly 64 also includes a printed circuit board (PCB) 66 with a number of board contacts 68 at a bottom surface of the PCB 66. The PCB 66 resides over the thermally enhanced package 10 and each solder pad 60 on the first mold compound 18 is electrically connected to a corresponding board contact 68. Furthermore, the PCB 66 may also include a heat sink structure 70 at the bottom surface of the PCB 66, which is in thermal contact with the first heat extractor 20 via a thermal attach layer 72. The thermal attach layer 72 may be formed of thermal adhesives or thermal greases, such as thermal conductive epoxies, thermal conductive silicones, alumina thermal adhesives, or other materials that can intermediate the thermal interface between the first heat extractor 20 and the heat sink structure 70. Various viscosities, hardnesses, and cure speed specifications of the thermal attach layer 72 are available. The thermal attach layer 72 may have a thermal conductivity more than 0.5 w/m·k, or between 1 w/m·k and 3 w/m·k. If the PCB 66 does not include a heat sink structure 70, there may be no need to thermally couple the first heat extractor 20 to the PCB 66. In some applications, the solder balls 62 instead of the solder pads 60 are used to electrically connect the TMVs 58 to corresponding board contacts 68, as illustrated in FIG. 8. The sink structure 70 in the PCB 66 and the thermal attach layer 72 may be omitted.

FIGS. 9A-9E provide exemplary steps that illustrate a process to fabricate the exemplary thermally enhanced package 10 shown in FIG. 1. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 9A-9E. If the carrier 12 is a laminate carrier, the exemplary steps are fabricated in a module level. If the carrier 12 is a WLFO carrier or a WLFI carrier, the exemplary steps are fabricated in a wafer level.

Figure 9A:
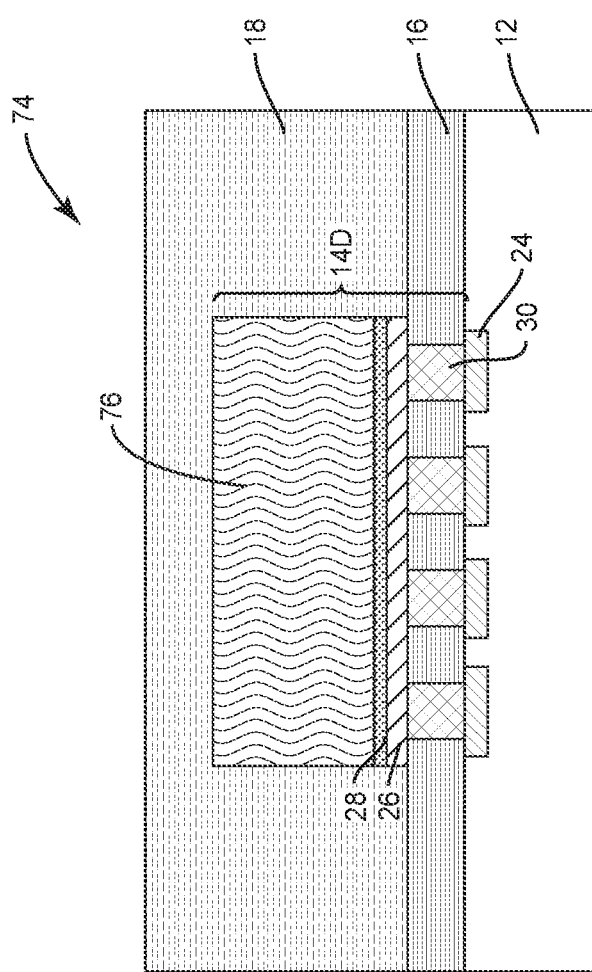

Initially, a precursor package 74 is provided as depicted in FIG. 9A. For the purpose of this illustration, the precursor package 74 includes the carrier 12 with the first carrier contacts 24, a first die 14D, the underfilling layer 16, and the first mold compound component 18. In different applications, the precursor package 74 may include multiple dies. Herein, the first die 14D includes the first device layer 26, the first dielectric layer 28 over the top surface of the first device layer 26, the first interconnects 30 (only one first interconnect is labeled with a reference number for clarity) extending from the bottom surface of the first device layer 26 to the top surface of the carrier 12, and a first die substrate 76 over the top surface of the first dielectric layer 28. As such, a backside of the first die substrate 76 is a top surface of the first die 14D. Herein, each of the first interconnects 30 is electrically connected to a corresponding first carrier contact 24 in the carrier 12.

In one embodiment, the first die 14D may be formed from a SOI structure. The first device layer 26 of the first die 14D is formed by integrating electronic components (not shown) in or on the silicon epitaxy layer of the SOI structure. The first dielectric layer 28 of the first die 14D is the BOX layer of the SOI structure. The first die substrate 76 of the first die 14D is the silicon substrate of the SOI structure. The first die 14D has a thickness between 25 μm and 250 μm or between 25 μm and 750 μm, and the first die substrate 76 has a thickness between 25 μm and 250 μm or between 25 μm and 750 μm, respectively.

In addition, the underfilling layer 16 resides over the top surface of the carrier 12, such that the underfilling layer 16 encapsulates the first interconnects 30 and underfills the first die 14D between the bottom surface of the first device layer 26 and the top surface of the carrier 12. The first mold compound 18 resides over the underfilling layer 16 and encapsulates the first die 14D. The first mold compound 18 may be used as an etchant barrier to protect the first die 14D against etching chemistries such as Tetramethylammonium hydroxide (TMAH), potassium hydroxide (KOH), sodium hydroxide (NaOH), and acetylcholine (ACH) in the following steps.

Figure 9B:
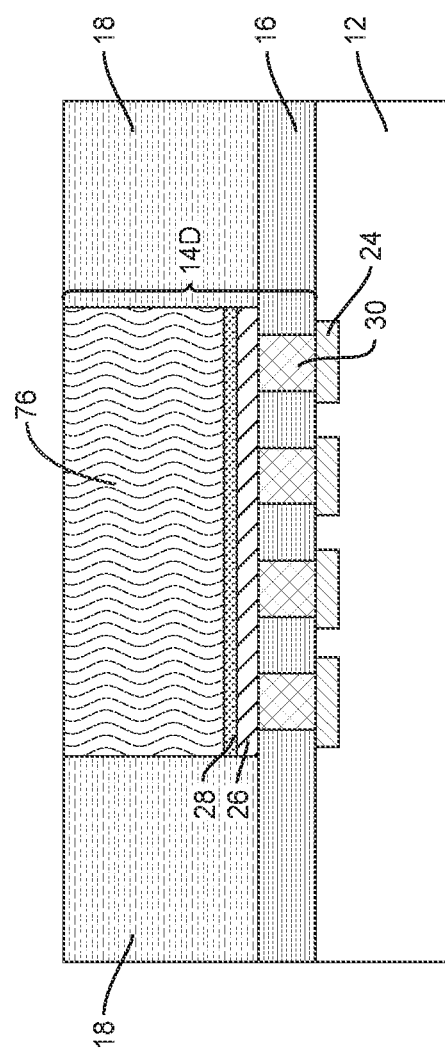
Figure 9C:
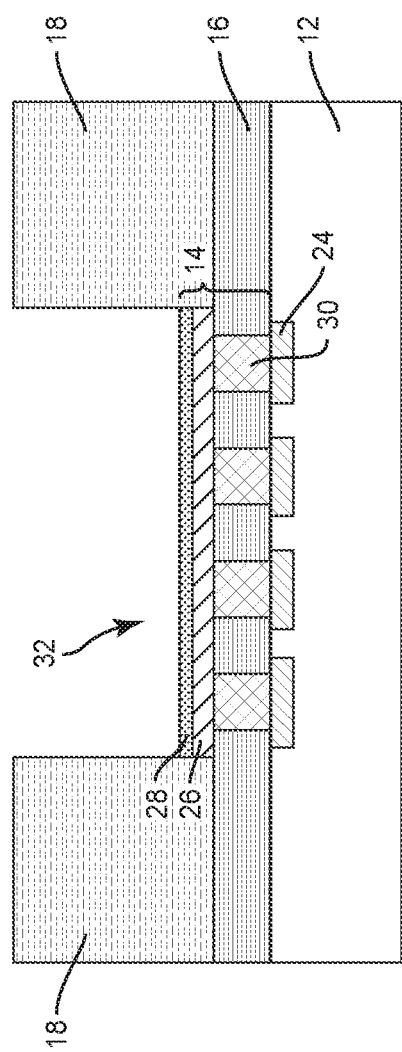

Next, the first mold compound 18 is thinned down to expose the backside of the first die substrate 76 of the first die 14D, as shown in FIG. 9B. The thinning procedure may be done with a mechanical grinding process. The following step is to remove substantially the first die substrate 76 of the first die 14D to create the first opening 32 and provide the first thinned die 14, as illustrated in FIG. 9C. Herein, removing substantially the first die substrate 76 refers to removing at least 99% of the entire first die substrate 76, and perhaps a portion of the first dielectric layer 28. In desired cases, the first die substrate 76 is fully removed. As such, the first thinned die 14 may refer to a thinned die including the first device layer 26, the first dielectric layer 28 over the first device layer 26, and the first interconnects 30 extending from the first device layer 24 to the carrier 12. Herein, the top surface of the first dielectric layer 28 is the top surface of the first thinned die 14, and is exposed to the first opening 32. Removing substantially the first die substrate 76 may be provided by an etching process with a wet/dry etchant chemistry, which may be TMAH, KOH, ACH, NaOH, or the like.

Figure 9D:
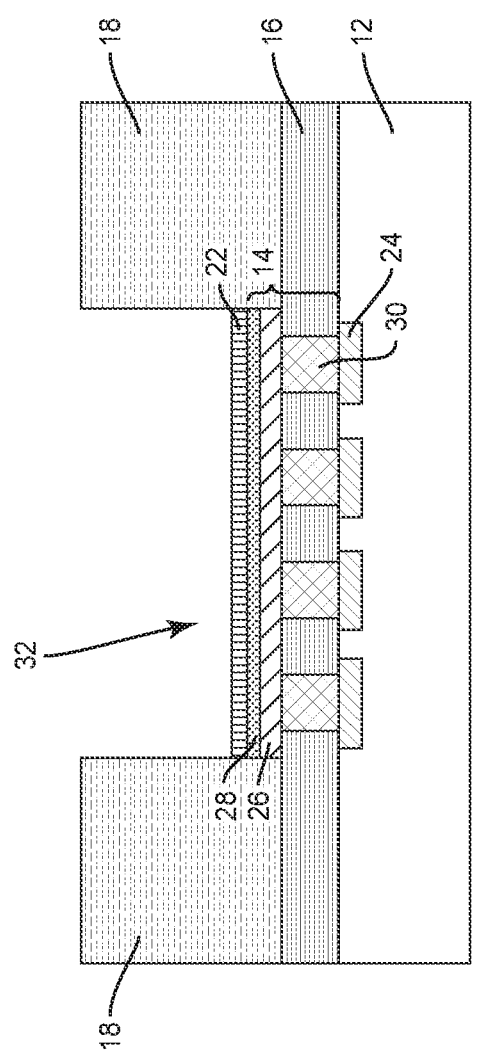
Figure 9E:
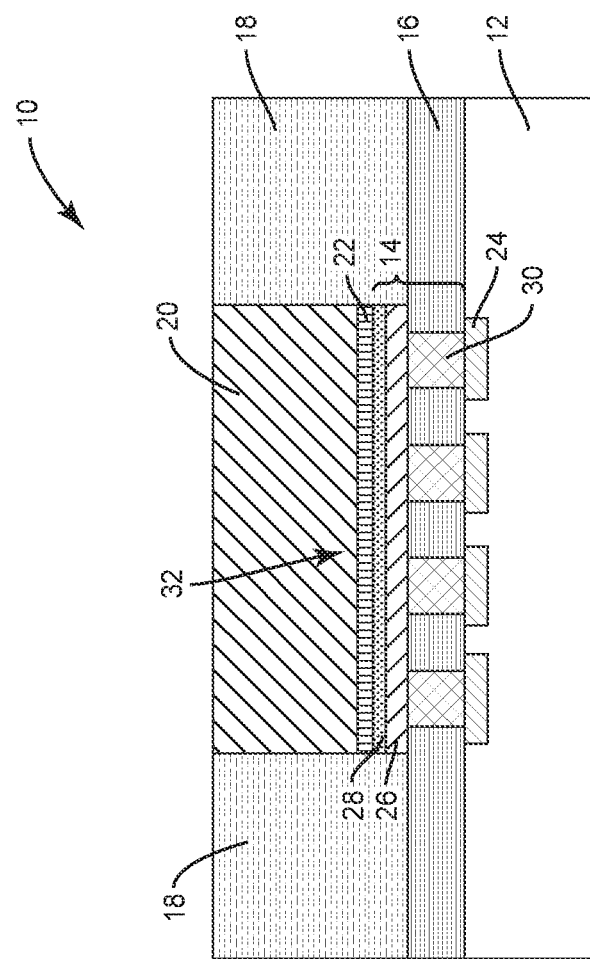

The first attach layer 22 is then applied over the top surface of the first thinned die 14 at the bottom of the first opening 32, as shown in FIG. 9D. The first attach layer 22 may be applied by roughly spreading, smoothly spreading, or special shape application methods. Some typical shapes used to apply the first attach layer 22 are: dot in the middle, two rice shaped dots, thin line, thick line, multiple lines, spiral pattern, X-shape, circle shape, circle with dot in the middle, etc. Finally, at least a portion of the first heat extractor 20 is inserted into the first opening 32 and in contact with the first attach layer 22, as shown in FIG. 9E. As such, the first heat extractor 20 is in thermal contact with the first thinned die 14 and configured to absorb the heat generated from the first thinned die 14.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
   a carrier having a top surface and a bottom surface opposite the top surface of the carrier, wherein the carrier comprises a plurality of antenna patches at the bottom surface of the carrier;
   a first thinned die comprising a first device layer over the top surface of the carrier and a first dielectric layer over the first device layer, wherein:
   the first dielectric layer and the first device layer have a same plane size;
   the first thinned die and the plurality of antenna patches are located on opposite sides of the carrier; and
   the first thinned die is electrically connected to each of the plurality of antenna patches;
   a first mold compound residing on the top surface of the carrier, surrounding the first thinned die, and extending beyond a top surface of the first thinned die to define a first opening within the first mold compound and over the first thinned die, wherein:
   the first mold compound does not reside over the first thinned die, such that the first dielectric layer and the first device layer do not extend horizontally beyond the first opening;
   the first mold compound provides vertical walls of the first opening, which are aligned with edges of the first thinned die in both X-direction and Y-direction;
   the X-direction and the Y-direction are parallel to the top surface of the carrier, and the X-direction and the Y-direction are orthogonal to each other; and
   the top surface of the first thinned die is a top surface of the first dielectric layer, and is at a bottom of the first opening;
   a first heat extractor inserted into the first opening and in thermal contact with the first thinned die, wherein:
   the first heat extractor, which is surrounded by the first mold compound, does not horizontally extend beyond the first thinned die in both the X-direction and the Y-direction; and
   the first heat extractor is formed of a metal or an alloy; and
   a second mold compound, which is formed over the first mold compound and encapsulates the first heat extractor, wherein:
   the first mold compound, the second mold compound, and the first heat extractor are formed of different materials; and
   no portion of the first mold compound is over a top surface of the first heat extractor.

2. The apparatus of claim 1 wherein the first heat extractor is attached to the first thinned die via an attach layer, which is formed of one of a group consisting of thermal conductive epoxies, thermal conductive silicones, or alumina thermal adhesives, wherein the attach layer does not horizontally extend beyond the first thinned die in both the X-direction and the Y-direction.

3. The apparatus of claim 1 wherein the first heat extractor has both an X-direction dimension and a Y-direction dimension essentially the same as the first thinned die.

4. The apparatus of claim 3 wherein:
   the first heat extractor fully fills the first opening; and
   a top surface of the first heat extractor and a top surface of the first mold compound are essentially at a same plane.

5. The apparatus of claim 1 wherein the first thinned die further comprises a plurality of interconnects extending from a bottom surface of the first device layer to the top surface of the carrier.

6. The apparatus of claim 5 further comprising an underfilling layer, which resides between the first mold compound and the top surface of the carrier, and underfills the first thinned die between the bottom surface of the first device layer and the top surface of the carrier.

7. The apparatus of claim 6 wherein the underfilling layer is formed from a same material as the first mold compound.

8. The apparatus of claim 5 wherein each of the plurality of antenna patches is electrically connected to a corresponding interconnect.

9. The apparatus of claim 5 wherein the carrier comprises a plurality of carrier contacts at the top surface of the carrier, wherein each of the plurality of interconnects is electrically connected to a corresponding carrier contact in the plurality of carrier contacts.

10. The apparatus of claim 9 further comprising at least one through mold via (TMV), which is electrically connected to the first thinned die via a corresponding carrier contact, and extends through the first mold compound and the second mold compound from a bottom surface of the first mold compound to a top surface of the first mold compound.

11. The apparatus of claim 10 further comprising at least one solder pad or at least one solder ball formed over the second mold compound and electrically connected to the at least one TMV.

12. The apparatus of claim 1 wherein the carrier is one of a group consisting of a laminate carrier, a wafer level fan out (WLFO) carrier, a wafer level fan in (WLFI) carrier, a lead frame, and a ceramic carrier.

13. An apparatus comprising:
   a carrier having a top surface;
   a first thinned die comprising a first device layer over the top surface of the carrier and a first dielectric layer over the first device layer;
   a first mold compound residing on the top surface of the carrier, surrounding the first thinned die, and extending beyond a top surface of the first thinned die to define a first opening within the first mold compound and over the first thinned die, wherein:
   the first mold compound does not reside over the first thinned die and provides vertical walls of the first opening, which are aligned with edges of the first thinned die in both X-direction and Y-direction;
   the X-direction and the Y-direction are parallel to the top surface of the carrier, and the X-direction and the Y-direction are orthogonal to each other; and
   the top surface of the first thinned die is at a bottom of the first opening; and
   a first heat extractor, which is formed of a metal or an alloy, inserted into the first opening, wherein a top surface of the first heat extractor is lower than a top surface of the first mold compound;

at least a portion of a second heat extractor, which is formed of a metal or alloy, inserted into the first opening and over the first heat extractor, wherein:
the second heat extractor is attached to the first heat extractor via an attach layer, which is formed of one of a group consisting of thermal conductive epoxies, thermal conductive silicones, or alumina thermal adhesives; and
the first heat extractor, the second heat extractor, and the first thinned die are thermally connected.

14. An apparatus comprising:
a carrier having a top surface and a bottom surface opposite the top surface of the carrier, wherein the carrier comprises a plurality of antenna patches at the bottom surface of the carrier;
a first thinned die comprising a first device layer over the top surface of the carrier and a first dielectric layer over the first device layer, wherein:
the first dielectric layer and the first device layer have a same plane size;
the first thinned die and the plurality of antenna patches are located on opposite sides of the carrier; and
the first thinned die is electrically connected to each of the plurality of antenna patches;
a first mold compound residing on the top surface of the carrier, surrounding the first thinned die, and extending beyond a top surface of the first thinned die to define a first opening within the first mold compound and over the first thinned die, wherein:
the first mold compound does not reside over the first thinned die, such that the first dielectric layer and the first device layer do not extend horizontally beyond the first opening;
the first mold compound provides vertical walls of the first opening, which are aligned with edges of the first thinned die in both X-direction and Y-direction;
the X-direction and the Y-direction are parallel to the top surface of the carrier, and the X-direction and the Y-direction are orthogonal to each other; and
the top surface of the first thinned die is a top surface of the first dielectric layer, and is at a bottom of the first opening;
at least one portion of a first heat extractor inserted into the first opening and in thermal contact with the first thinned die, wherein:
the at least one portion of the first heat extractor, which is surrounded by the first mold compound, does not horizontally extend beyond the first thinned die in both the X-direction and the Y-direction; and
the first heat extractor is formed of a metal or an alloy; and
a printed circuit board (PCB) with at least one board contact and a heat sink structure on a bottom surface of the PCB, wherein:
the bottom surface of the PCB is over the first mold compound and over the first heat extractor; and
the heat sink structure is in thermal contact with the first heat extractor.

15. The apparatus of claim 14 further comprising at least one through mold via (TMV), wherein:
the first thinned die further comprises a plurality of interconnects extending from a bottom surface of the first device layer to the top surface of the carrier;
the carrier comprises a plurality of carrier contacts at the top surface of the carrier, wherein each of the plurality of interconnects is electrically connected to a corresponding carrier contact in the plurality of carrier contacts;
the at least one TMV is electrically connected to the first thinned die via a corresponding carrier contact, and extends through the first mold compound from a bottom surface of the first mold compound to a top surface of the first mold compound; and
the at least one TMV is electrically connected to the at least one board contact.

* * * * *